(12) United States Patent
Kikuchi

(10) Patent No.: US 12,002,785 B2
(45) Date of Patent: Jun. 4, 2024

(54) SEMICONDUCTOR DEVICE

(71) Applicant: ROHM CO., LTD., Kyoto (JP)

(72) Inventor: Tomohira Kikuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/159,576

(22) Filed: Jan. 25, 2023

(65) Prior Publication Data

US 2023/0170326 A1    Jun. 1, 2023

Related U.S. Application Data

(63) Continuation of application No. 17/253,359, filed as application No. PCT/JP2019/025313 on Jun. 26, 2019, now Pat. No. 11,594,517.

(30) Foreign Application Priority Data

Jul. 12, 2018 (JP) ................................ 2018-132135

(51) Int. Cl.
*H01L 23/495* (2006.01)
*H01L 23/00* (2006.01)
(Continued)

(52) U.S. Cl.
CPC .... *H01L 25/0655* (2013.01); *H01L 23/49575* (2013.01); *H01L 23/5227* (2013.01);
(Continued)

(58) Field of Classification Search
CPC ........... H01L 25/0655; H01L 23/49575; H01L 23/49548
See application file for complete search history.

(56) References Cited

U.S. PATENT DOCUMENTS

| 2003/0112605 | A1 | 6/2003 | Hable |
|---|---|---|---|
| 2004/0227547 | A1 | 11/2004 | Shiraishi et al. |

(Continued)

FOREIGN PATENT DOCUMENTS

| JP | 2008-177309 A | 7/2008 |
|---|---|---|
| JP | 2013-51547 A | 3/2013 |

(Continued)

OTHER PUBLICATIONS

International Search Report issued in PCT/JP2019/025313, dated Sep. 10, 2019 (1 page).

(Continued)

*Primary Examiner* — Michele Fan
(74) *Attorney, Agent, or Firm* — HSML P.C.

(57) ABSTRACT

A semiconductor device includes a conductive support member, a control element, an insulating element, a driver element and a sealing resin. The conductive support member includes a first lead and a second lead. The first lead has a first pad portion. The second lead has a second pad portion. The second pad portion is adjacent to the first pad portion in a first direction perpendicular to a thickness direction of the first pad portion. The control element is mounted on the first pad portion. The insulating element is mounted on the first pad portion and electrically connected to the control element. The driver element is mounted on the second pad portion and electrically connected to the insulating element. The sealing resin covers the first pad portion, the second pad portion, the control element, the insulating element and the driver element. As viewed in the thickness direction, the first pad portion has a first edge adjacent to the second pad portion in the first direction and extending in a second direction perpendicular to the thickness direction and the first direction. The first edge has a first end and a second end opposite in the second direction. As viewed in the thickness (Continued)

direction, the second pad portion has a second edge adjacent to the first edge in the first direction and extending in the second direction. The second edge has a third end and a fourth end opposite in the second direction. One of the third end and the fourth end is located between the first end and the second end in the second direction.

15 Claims, 21 Drawing Sheets

(51) Int. Cl.
*H01L 23/522* (2006.01)
*H01L 23/544* (2006.01)
*H01L 25/065* (2023.01)
*H01L 23/31* (2006.01)

(52) U.S. Cl.
CPC ............ *H01L 23/544* (2013.01); *H01L 24/05* (2013.01); *H01L 24/32* (2013.01); *H01L 24/48* (2013.01); *H01L 24/73* (2013.01); *H01L 23/3107* (2013.01); *H01L 2224/05554* (2013.01); *H01L 2224/32245* (2013.01); *H01L 2224/48137* (2013.01); *H01L 2224/48245* (2013.01); *H01L 2224/73265* (2013.01)

(56) References Cited

U.S. PATENT DOCUMENTS

| | | |
|---|---|---|
| 2005/0231990 A1 | 10/2005 | Uno et al. |
| 2006/0113664 A1 | 6/2006 | Shiraishi et al. |
| 2009/0218683 A1 | 9/2009 | Satou et al. |
| 2012/0261825 A1 | 10/2012 | Koike et al. |
| 2012/0326289 A1 | 12/2012 | Minamio |
| 2013/0049137 A1 | 2/2013 | Uno et al. |
| 2014/0061821 A1 | 3/2014 | Kawano et al. |
| 2016/0027732 A1 | 1/2016 | Igarashi et al. |
| 2016/0035672 A1 | 2/2016 | Funaya et al. |
| 2018/0182719 A1 | 6/2018 | Muto et al. |
| 2019/0115291 A1 | 4/2019 | Chen |
| 2019/0221504 A1 | 7/2019 | Nishiyama |
| 2020/0194353 A1 | 6/2020 | Yokoyama et al. |

FOREIGN PATENT DOCUMENTS

| | | |
|---|---|---|
| JP | 2016-207714 A | 12/2016 |
| WO | 2016/072012 A1 | 5/2016 |
| WO | 2018/096573 A1 | 5/2018 |

OTHER PUBLICATIONS

Office Action received in the corresponding Chinese Patent application, Apr. 29, 2023, and machine translation (12 pages).

SEMICONDUCTOR DEVICE

TECHNICAL FIELD

The present disclosure relates to a semiconductor device including a control element, a driver element and an insulating element electrically connected to the control element and the driver element.

BACKGROUND ART

Semiconductor devices for driving switching elements, such as IGBTs and MOSFETs, are widely known (as gate drivers). Patent document 1 discloses a semiconductor device including a driver element that outputs a gate voltage for driving a switching element, a control element that transmits an electric signal used as a base for generating the gate voltage to the driver element, and an insulating element electrically connected to the driver element and the control element.

The insulating element of the semiconductor device includes a pair of coils (inductors). One of the coils converts an electric signal transmitted from the control element into magnetic force. The other coil converts the magnetic force into an electric signal of a greater potential difference than the electric signal transmitted from the control element. The resulting electric signal is then transmitted to the driver element. The source voltage supplied to the driver element (about 600 volts or higher) is significantly higher than the source voltage supplied to the control element (about 5 volts). The insulating element enables transmission of electric signals between the control element and the driver element that are electrically insulated from each other, so that the control element is protected from a relatively high voltage.

In recent years, such semiconductor devices have been sought to be more compact for use in electrically-powered vehicles. The semiconductor devices are typically provided in resin packages formed by molding. A more compact semiconductor device means that a smaller volume of sealing resin is present between the low voltage section, which includes the control element, and the high voltage section, which includes the driver element. This may lower the dielectric strength of the semiconductor device. During the manufacture of the semiconductor device, in addition, wires connecting the control element or the driver element to conductive members, such as leads, may be pushed by the flow of synthetic resin injected for forming the sealing resin. As a result, the wires may be located too close to the insulating element, which can be another factor possibly reducing the dielectric strength of the semiconductor device.

PRIOR ART DOCUMENT

Patent Document

Patent Document 1: JP-A-2013-51547

SUMMARY OF THE INVENTION

Technical Problem

In view of the circumstances described above, the present disclosure aims to provide a semiconductor device that can be more compact without lowering the dielectric strength.

Solution to Problem

The present disclosure provides a semiconductor device that includes: a conductive support member including a first lead having a first pad portion and a second lead having a second pad portion adjacent to the first pad portion in a first direction perpendicular to a thickness direction of the first lead; a control element mounted on the first pad portion; an insulating element mounted on the first pad portion and electrically connected to the control element; a driver element mounted on the second pad portion and electrically connected to the insulating element; and a sealing resin covering the first pad portion, the second pad portion, the control element, the insulating element and the driver element. As viewed in the thickness direction, the first pad portion has a first edge adjacent to the second pad portion in the first direction and extending in a second direction perpendicular to the thickness direction and the first direction. The first edge has a first end and a second end opposite in the second direction. As viewed in the thickness direction, the second pad portion has a second edge adjacent to the first edge in the first direction and extending in the second direction. The second edge has a third end and a fourth end opposite in the second direction. One of the third end and the fourth end is located between the first end and the second end in the second direction.

Other features and advantages of the present disclosure will be more apparent from the detailed description given below with reference to the accompanying drawings.

MODE FOR CARRYING OUT THE INVENTION

Embodiments of the present disclosure will be described with reference to the accompanying drawings.

First Embodiment

Figure 14:
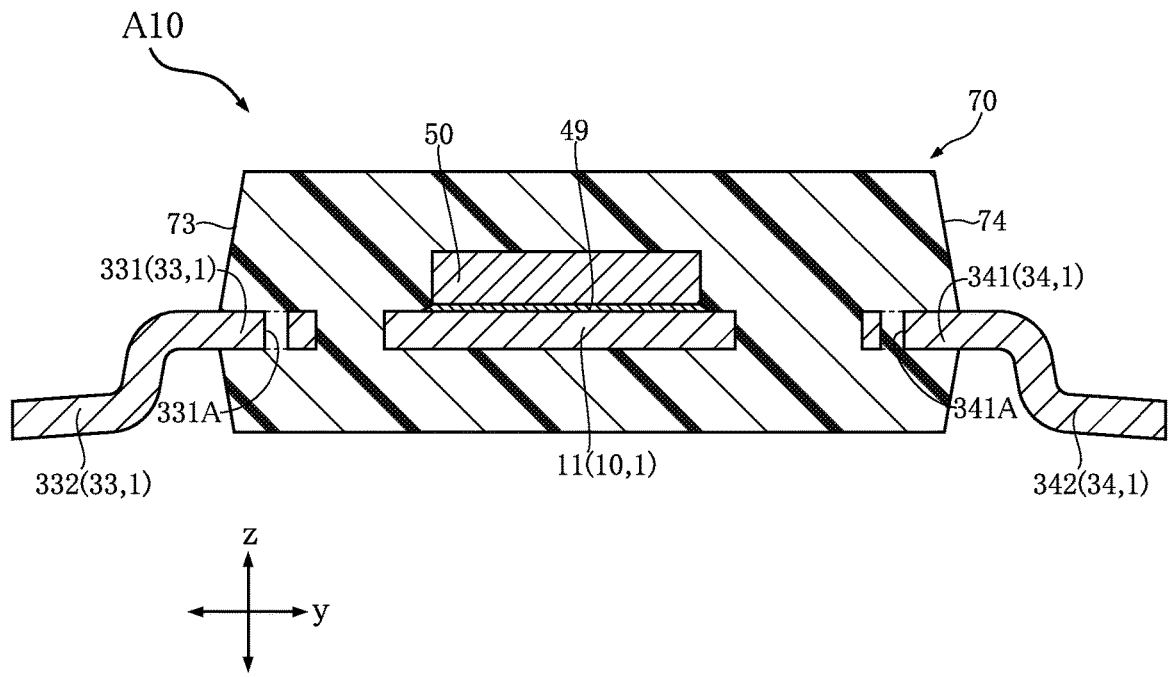
FIG. 14 is a sectional view taken along line XIV-XIV of FIG. 2.
Figure 15:
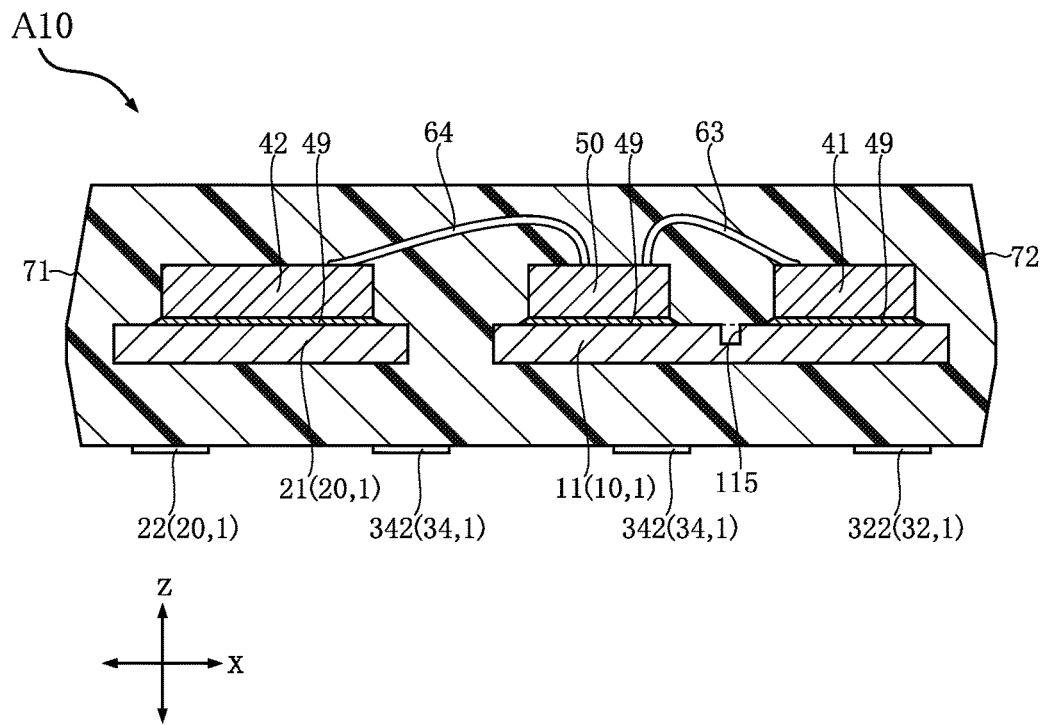
FIG. 15 is a sectional view taken along line XV-XV of FIG. 2.
Figure 16:
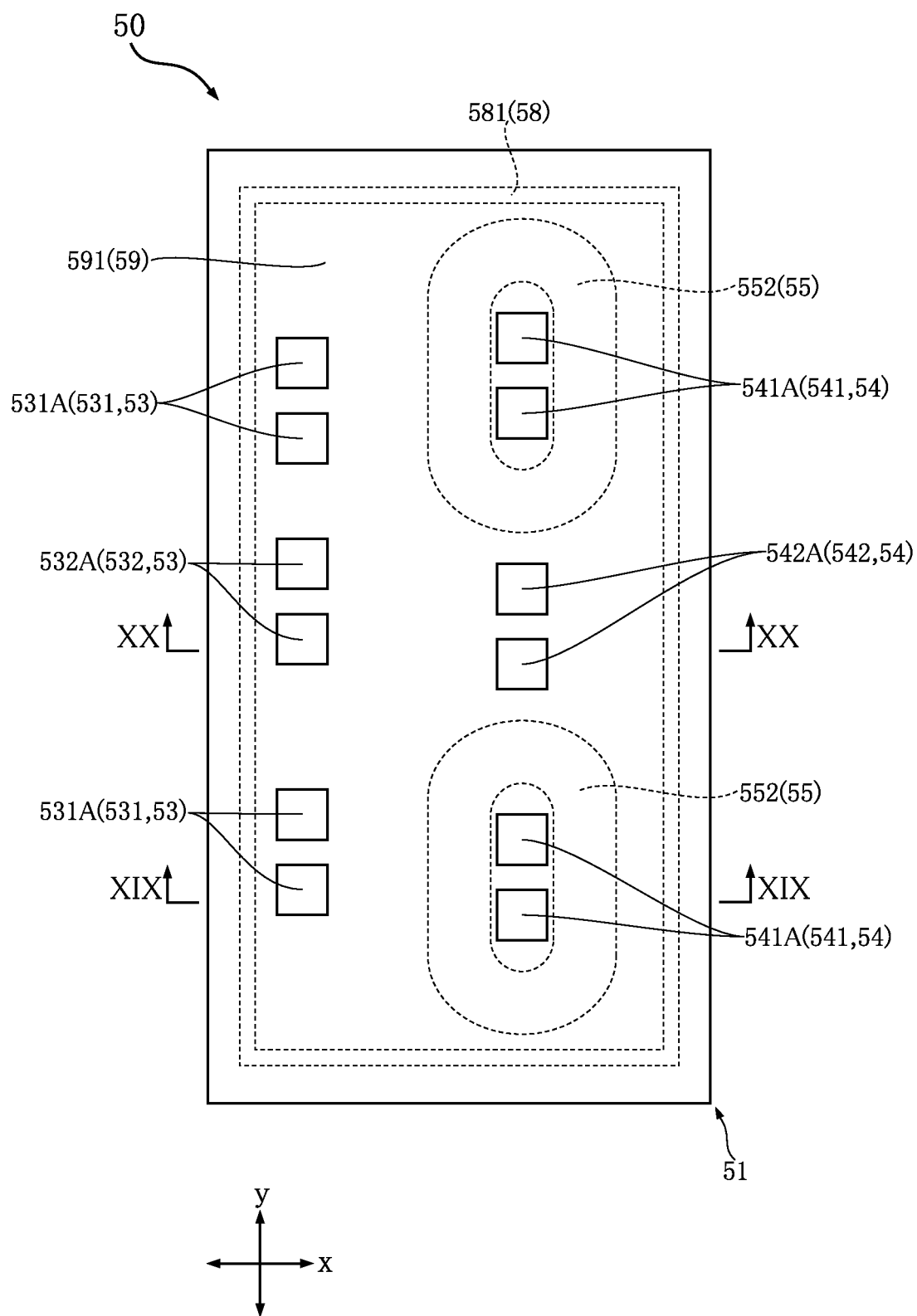
FIG. 16 is a plan view of the insulating element of the semiconductor device of FIG. 1, as seen through a coil protective film.
Figure 17:
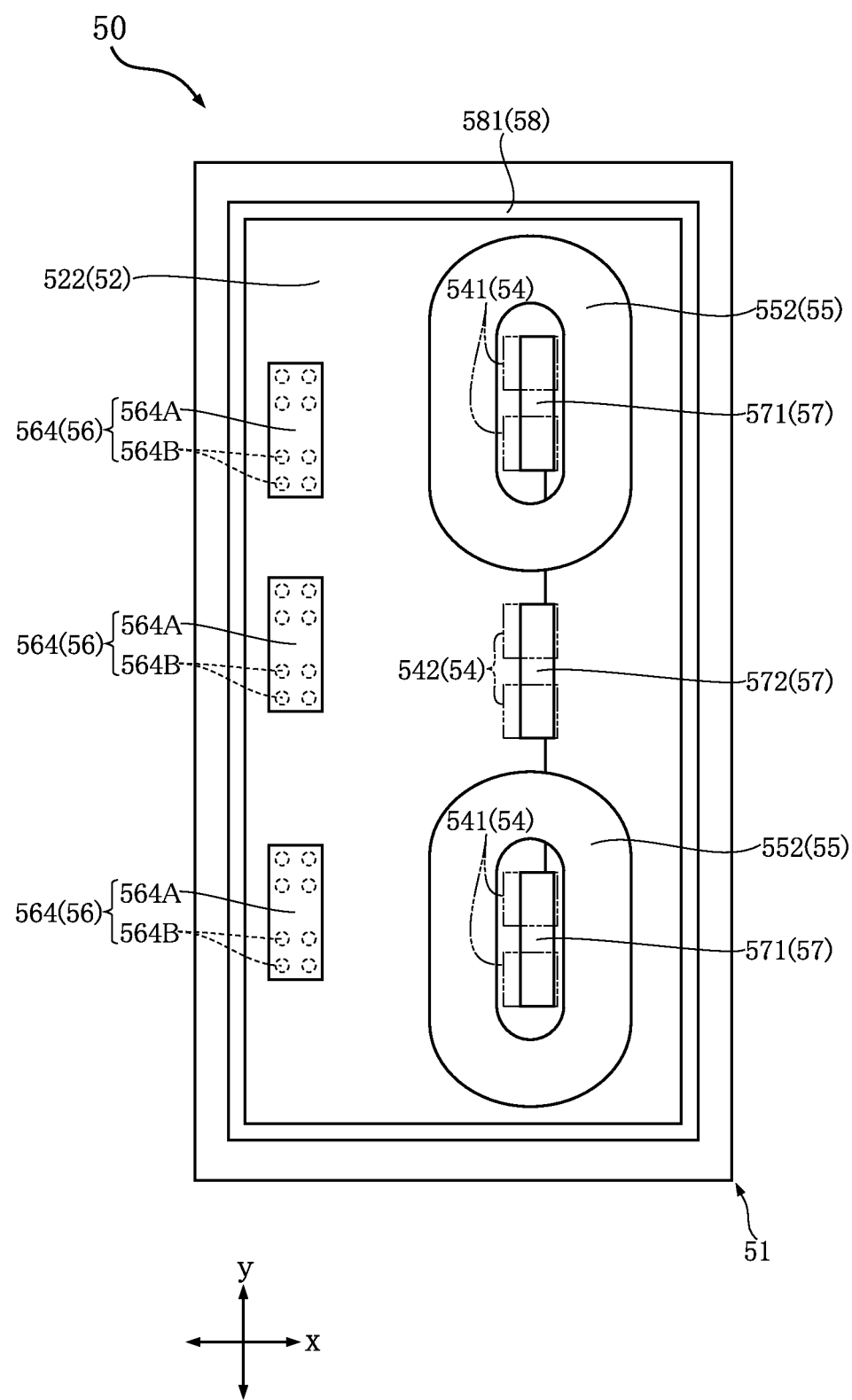
FIG. 17 is a plan view of the insulating element of the semiconductor device of FIG. 1, showing an upper surface of an eleventh insulating layer.
Figure 18:
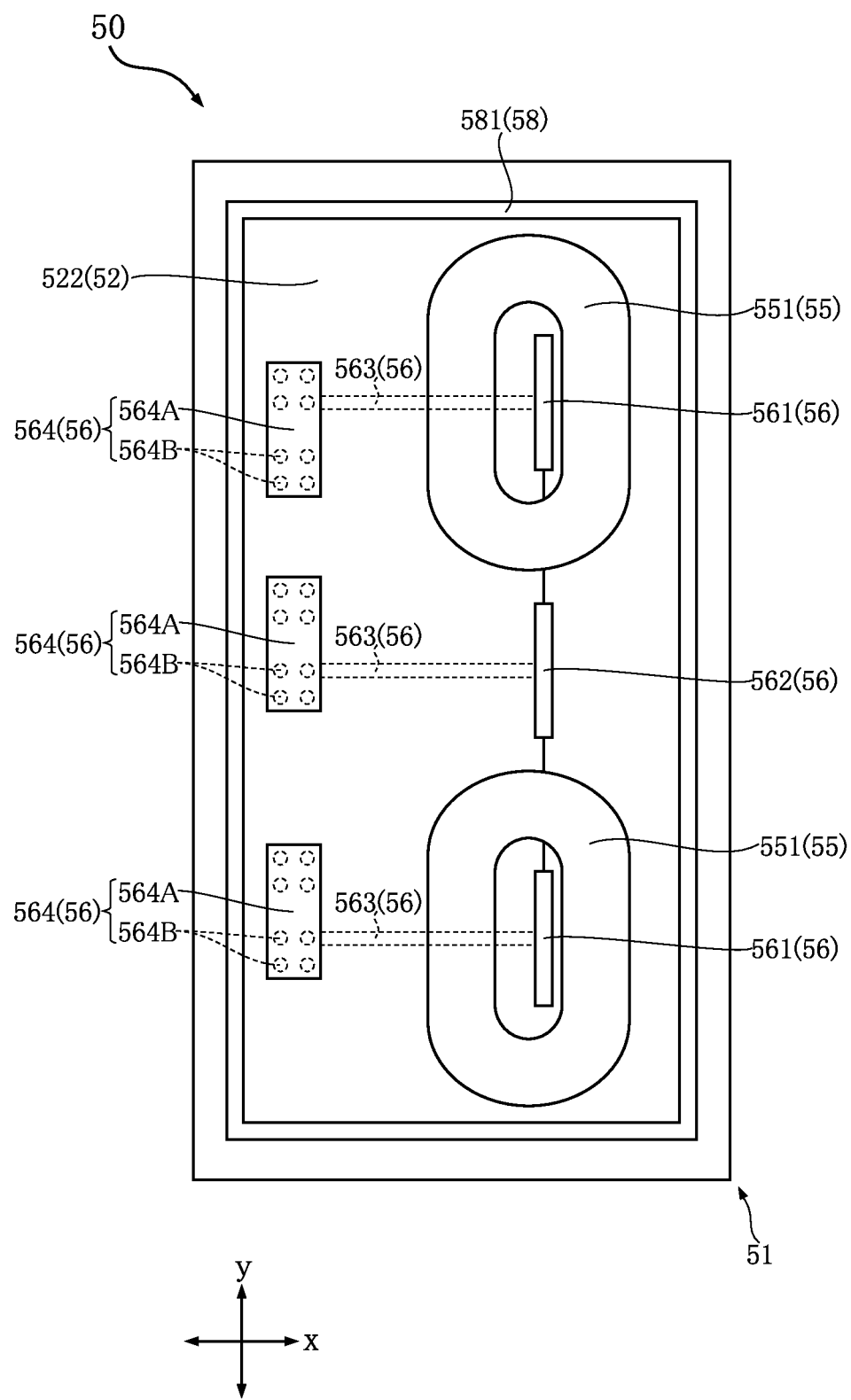
FIG. 18 is a plan view of the insulating element of the semiconductor device of FIG. 1, showing an upper surface of a fourth insulating layer.

With reference to FIGS. 1 to 20, a semiconductor device A10 according to a first embodiment of the present disclosure will be described. The semiconductor device A10 includes a conductive support member 1, a control element 41, a driver element 42, an insulating element 50, a plurality of first wires 61, a plurality of second wires 62, a plurality of third wires 63, a plurality of fourth wires 64 and a sealing resin 70. The conductive support member 1 includes a first lead 10, a second lead 20, a third lead 31, a fourth lead 32, a plurality of fifth leads 33 and a plurality of sixth leads 34. For convenience, FIG. 2 shows the sealing resin 70 in phantom by imaginary lines (two-dot chain lines). FIGS. 14 and 15 show sections taken along the one-dot chain lines in FIG. 2. FIG. 17 shows an upper surface of an eleventh insulating layer 52 (to be detailed later) counted from a semiconductor substrate 51 (to be detailed later). FIG. 18 shows an upper surface of a fourth insulating layer 52 counted from the semiconductor substrate 51.

In the description of the semiconductor device A10, the direction in the thickness of the conductive support member 1 (the first lead 10 etc.) is referred to as "thickness direction z". A direction perpendicular to the thickness direction z is referred to as "first direction x". The first pad portion 11 of the first lead 10 and the second pad portion 21 of the second lead 20 (both of which are detailed later) are spaced apart from each other in the first direction x. The direction perpendicular to the thickness direction z and the first direction x is referred to as "second direction y". As viewed in the thickness direction z, portions of the conductive support member 1 extend out of the sealing resin 70 in the second direction y.

Figure 1:
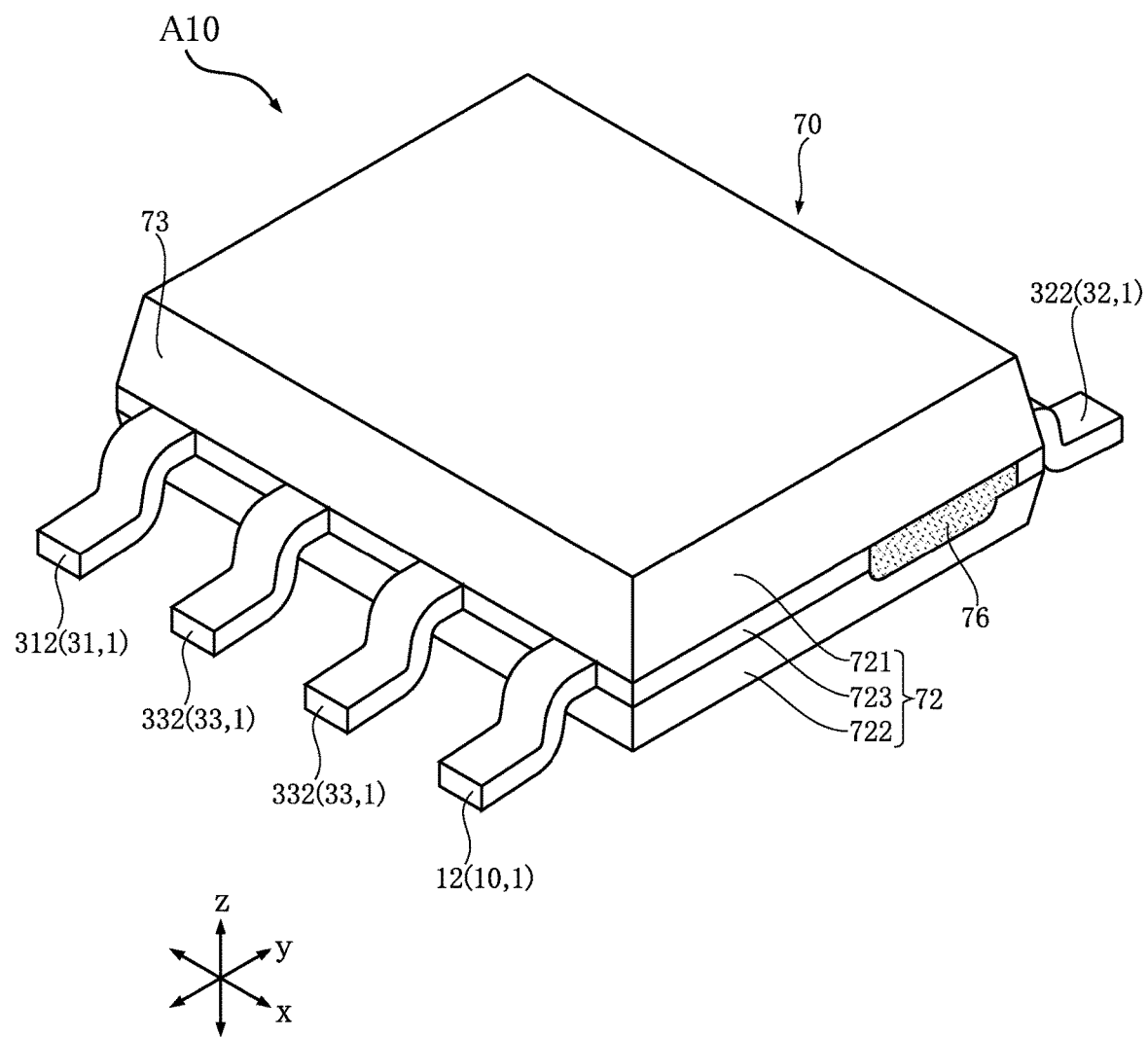
FIG. 1 is a perspective view of a semiconductor device according to a first embodiment of the present disclosure.
Figure 2:
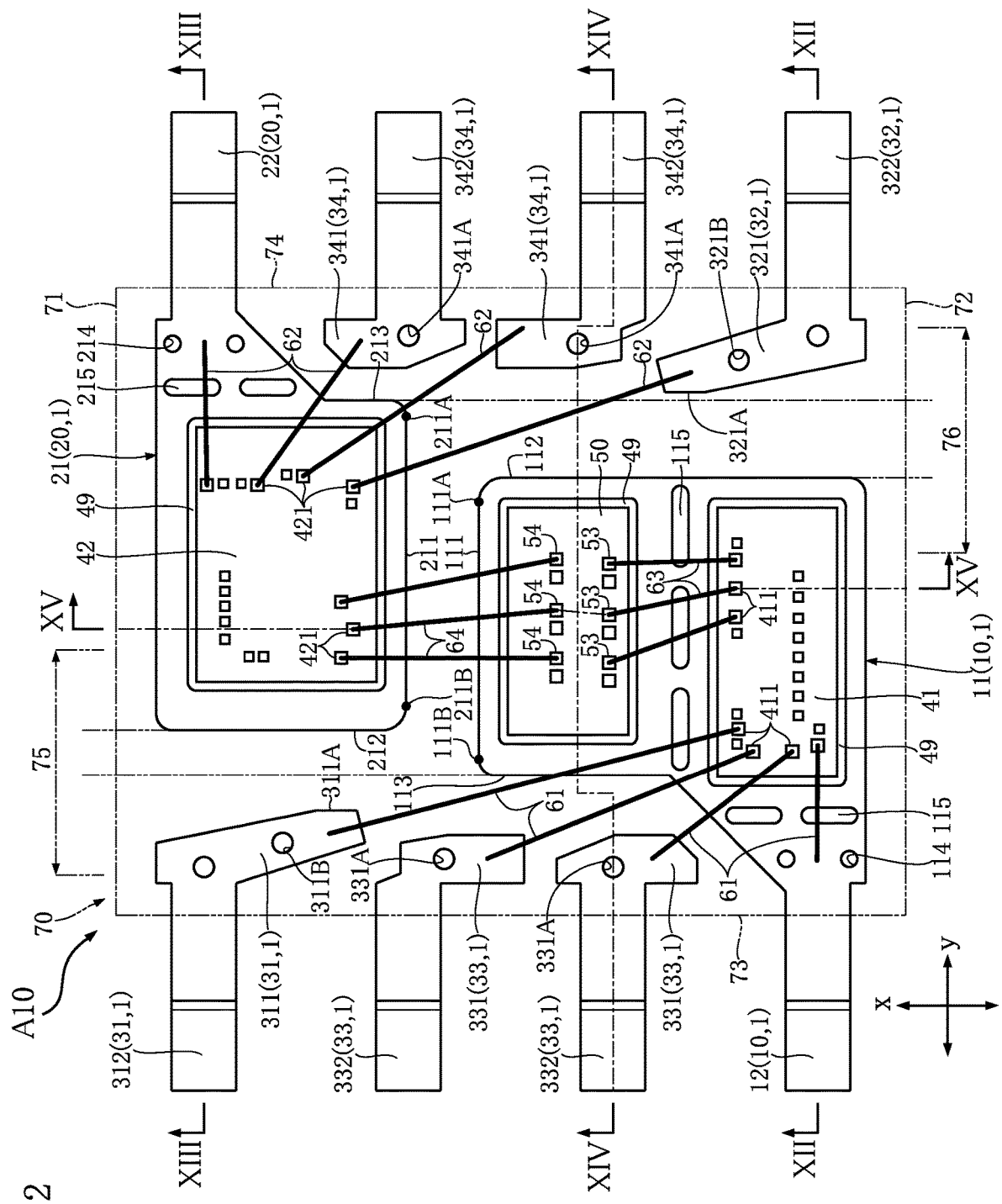
FIG. 2 is a plan view of the semiconductor device of FIG. 1, as seen through a sealing resin.

In the example shown in FIG. 1, the semiconductor device A10 is a gate driver for driving a switching element that converts DC power into AC power. The switching element may be an insulated gate bipolar transistor (IGBT) or a metal-oxide-semiconductor field-effect transistor (MOSFET). In this example, the semiconductor device A10 is described as driving an IGBT.

Figure 3:
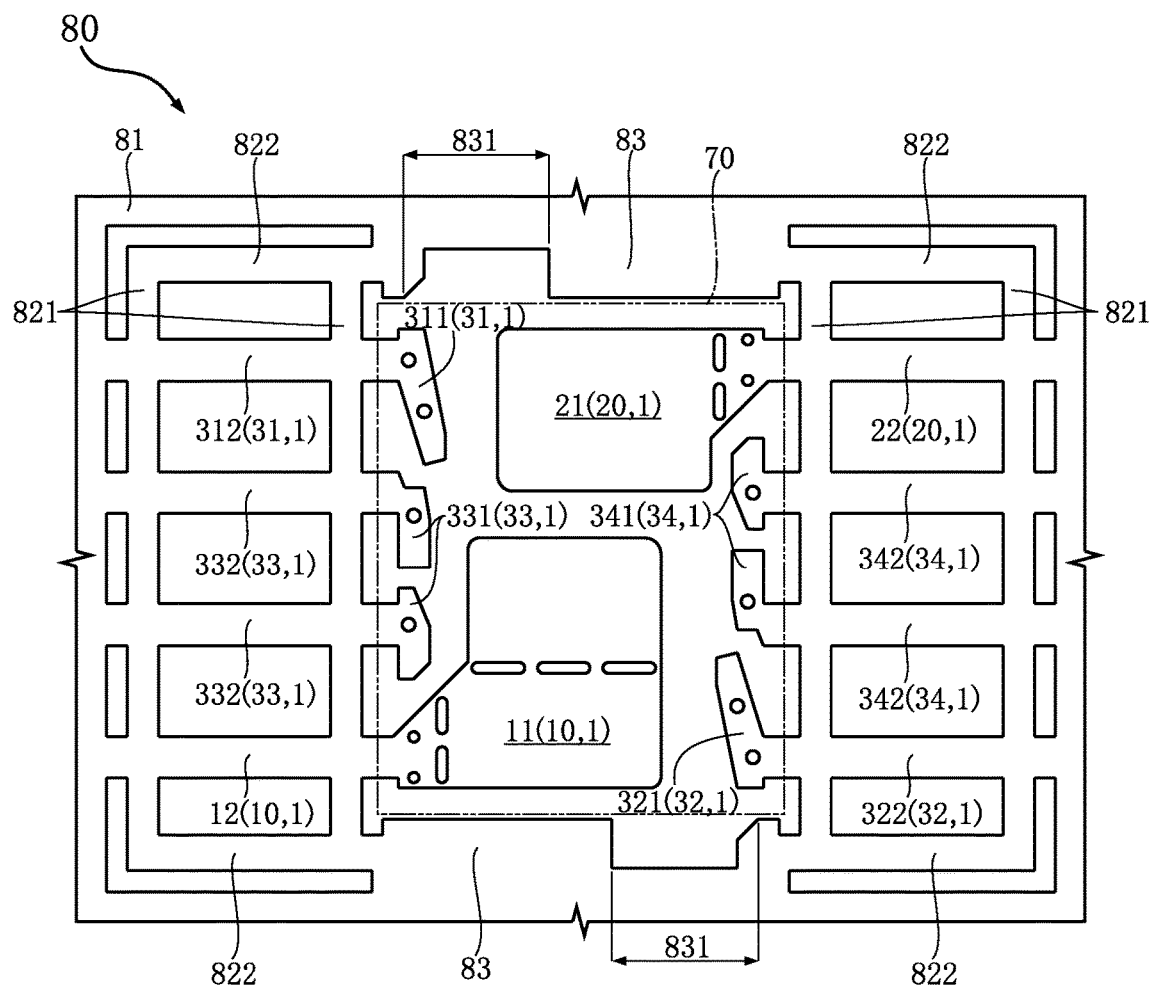
FIG. 3 is a plan view of a lead frame used to fabricate the semiconductor device of FIG. 1.

The conductive support member 1 provides conductive paths from the control element 41 and the driver element 42 to a wiring board on which the semiconductor device A10 is mounted. The conductive support member 1 is also a structure on which the control element 41, the driver element 42 and the insulating element 50 are mounted. As shown in FIG. 3, the conductive support member 1 is a part of a lead frame 80 (to be detailed later) used for fabricating the semiconductor device A10. In one example, the conductive support member 1 has a thickness of 200 μm. The conductive support member 1 is made of copper (Cu) or a copper alloy. The conductive support member 1 includes the first lead 10, the second lead 20, the third lead 31, the fourth lead 32, the fifth leads 33 and the sixth leads 34.

As shown in FIG. 2, the first lead 10 has the first pad portion 11.

As shown in FIGS. 2 and 15, the first pad portion 11 is where the control element 41 and the insulating element 50 are mounted. The first pad portion 11 is electrically connected to the control element 41 via one of the first wires 61. The first pad portion 11 is covered by the sealing resin 70. Most surface of the first pad portion 11 is coated with a metal layer, such as a silver (Ag) coating. The first pad portion 11 has a first edge 111.

As shown in FIG. 2 viewed in the thickness direction z, the first edge 111 is adjacent to the second pad portion 21 (to be detailed later) in the first direction x. The first edge 111 extends in the second direction y. The first edge 111 has a first end 111A and a second end 111B. The first end 111A is one end of the first edge 111 in the second direction y. The second end 111B is the other end of the first edge 111 in the second direction y. That is, the first end 111A and the second end 111B are opposite ends of the first edge 111.

As shown in FIG. 2, the second lead 20 has the second pad portion 21.

As shown in FIGS. 2 and 15, the second pad portion 21 is where the driver element 42 is mounted. The second pad portion 21 is adjacent to the first pad portion 11 in the first direction x. The second pad portion 21 is electrically connected to the driver element 42 via one of the second wires 62. The second pad portion 21 is covered by the sealing resin 70. Most surface of the second pad portion 21 is coated with a metal layer, such as a silver coating. The second pad portion 21 has a second edge 211.

As shown in FIG. 2 viewed in the thickness direction z, the second edge 211 is adjacent to the first edge 111 of the first pad portion 11 in the first direction x. The second edge 211 extends in the second direction y, and hence the second edge 211 is parallel to the first edge 111. The second edge 211 has a third end 211A and a fourth end 211B. The third end 211A is one end of the second edge 211 in the second direction y. The fourth end 211B is the other end of the second edge 211 in the second direction y. That is, the third end 211A and the fourth end 211B are opposite ends of the second edge 211.

As shown in FIG. 2, one of the third end 211A and the fourth end 211B of the second edge 211 is located between the first end 111A and the second end 111B of the first edge 111 in the second direction y. In the semiconductor device A10 of this embodiment, the fourth end 211B is located between the first end 111A and the second end 111B in the second direction y.

As shown in FIG. 2, the first pad portion 11 also has a third edge 112, a fifth edge 113, a plurality of first through holes 114 and a plurality of first recessed grooves 115.

Figure 4:
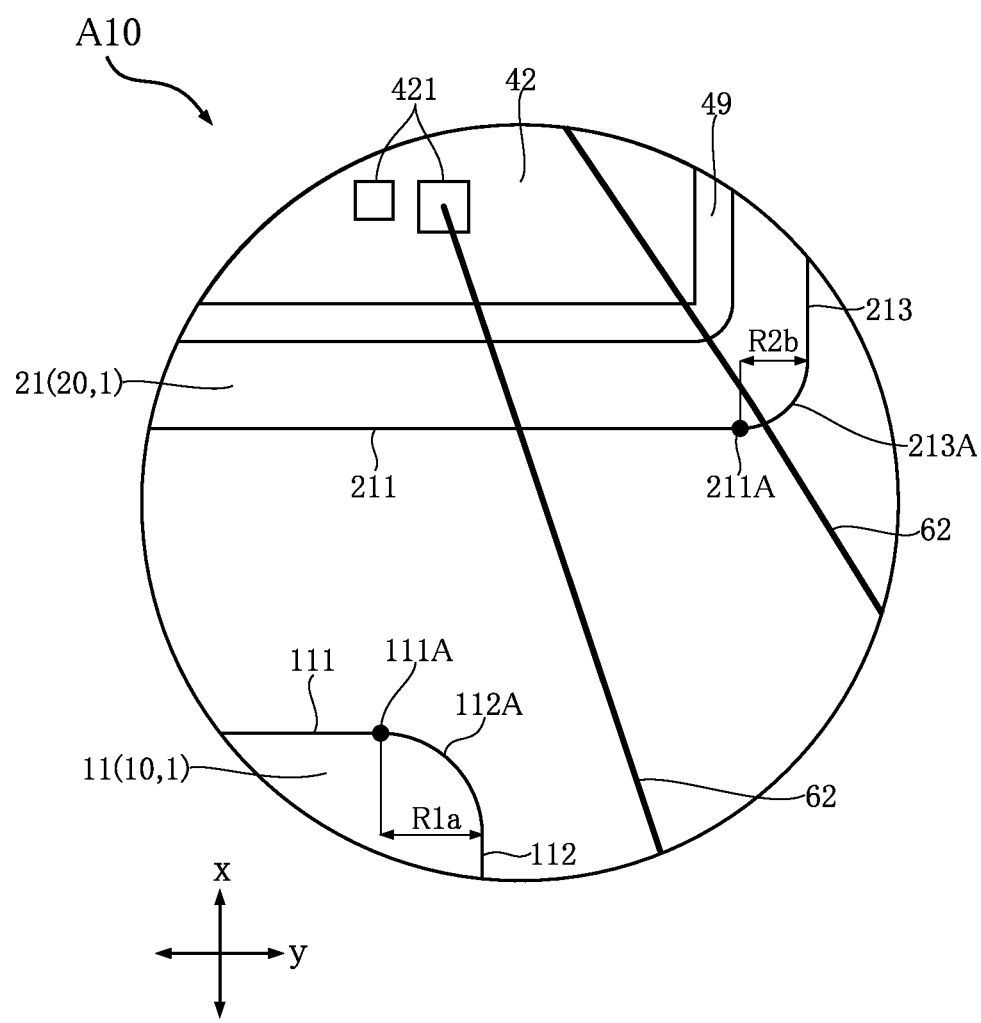
FIG. 4 is an enlarged view showing a part of FIG. 2.

As shown in FIG. 2 viewed in the thickness direction z, the third edge 112 includes a segment extending in the first direction x. The third edge 112 is connected to one of the first end 111A and the second end 111B of the first edge 111 that is located between the third end 211A and the fourth end 211B of the second edge 211 of the second pad portion 21 in the second direction y. In the semiconductor device A10, the third edge 112 is connected to the first end 111A. As shown in FIG. 4, the third edge 112 has a third-edge connecting portion 112A. The third-edge connecting portion 112A is connected to one of the first end 111A and the second end 111B. In the semiconductor device A10, the third-edge connecting portion 112A is connected to the first end 111A. The third-edge connecting portion 112A is convex toward the outside of the first pad portion 11. The third-edge connecting portion 112A defines an arc.

Figure 5:
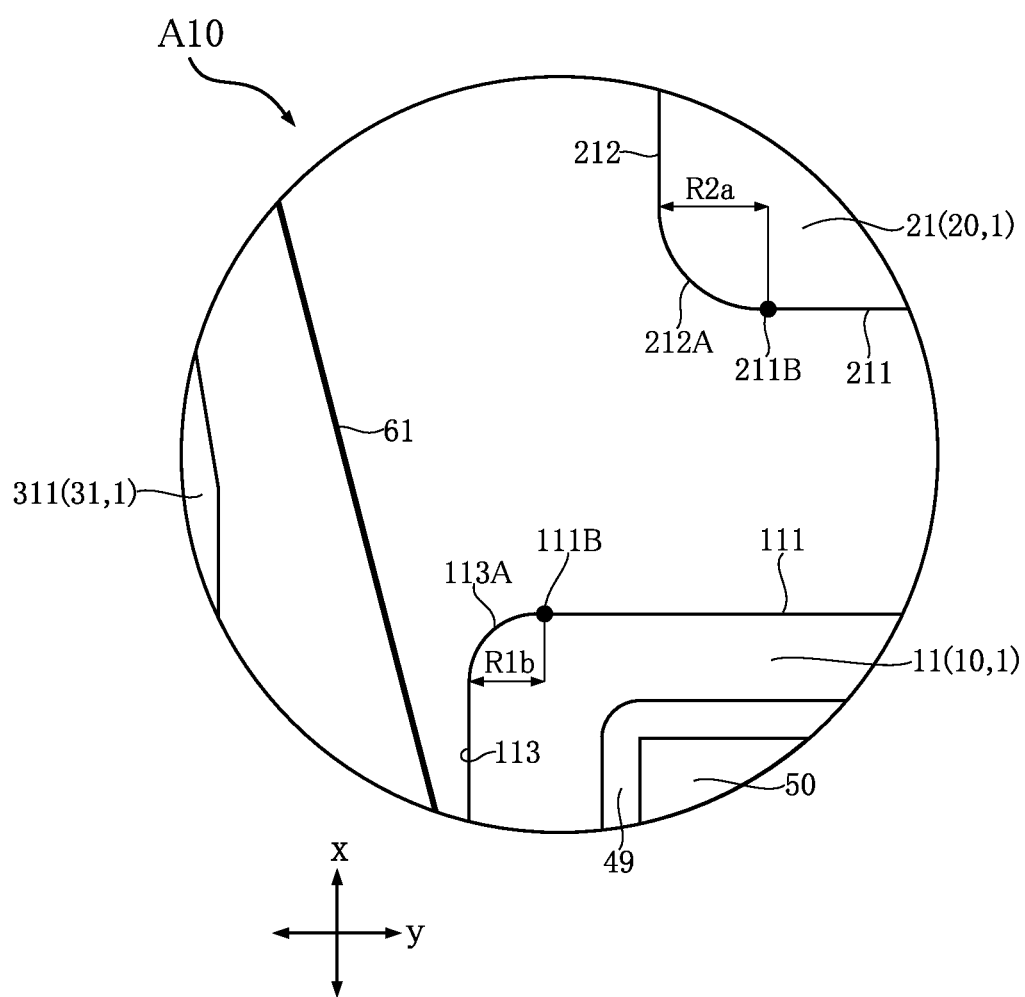
FIG. 5 is an enlarged view showing a part of FIG. 2.

As shown in FIG. 2 viewed in the thickness direction z, the fifth edge 113 is spaced apart from the third edge 112 in the second direction y and connected to the first edge 111. In the semiconductor device A10, the fifth edge 113 is connected to the second end 111B of the first end 111A. The fifth edge 113 includes a segment extending in the first direction x. As shown in FIG. 5, the fifth edge 113 has a fifth-edge connecting portion 113A. In the semiconductor device A10, the fifth-edge connecting portion 113A is connected to the second end 111B. The fifth-edge connecting portion 113A is convex toward the outside of the first pad portion 11. The fifth-edge connecting portion 113A defines an arc. The fifth-edge connecting portion 113A has a radius of curvature R1$b$ that is smaller than the radius of curvature R1$a$ of the third-edge connecting portion 112A of the third edge 112 shown in FIG. 4.

As shown in FIG. 2 viewed in the thickness direction z, the first through holes 114 are located near the boundary between the first pad portion 11 and the first terminal portion 12 (to be detailed later) and spaced apart from the control element 41 in the second direction y. Each first through hole 114 extends through the first pad portion 11 in the thickness direction z. The first through holes 114 are arrayed in the first direction x.

Figure 12:
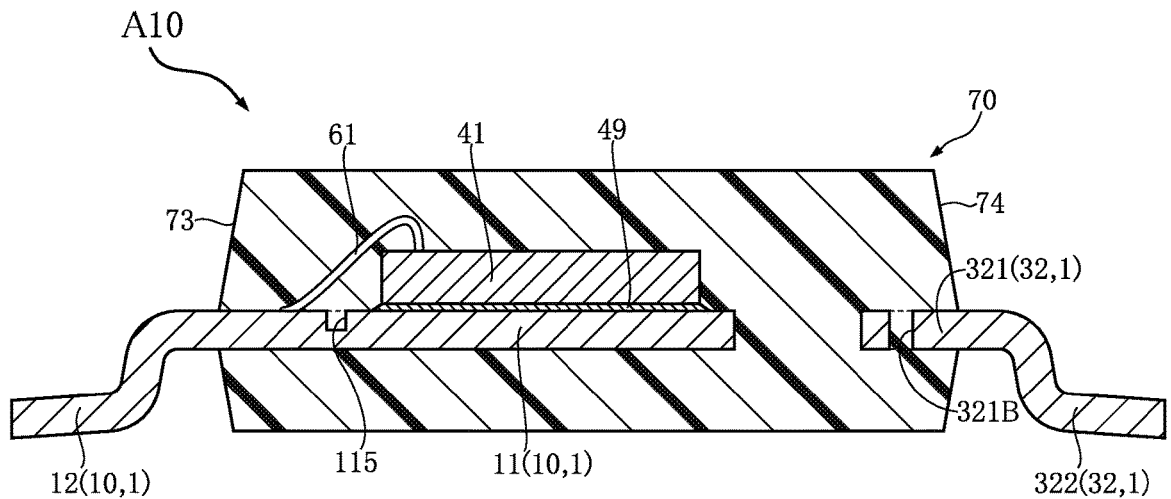
FIG. 12 is a sectional view taken along line XII-XII of FIG. 2.

As shown in FIGS. 12 an 15, the first recessed grooves 115 are recessed from the surface of the first pad portion 11 on which the control element 41 and the insulating element 50 are mounted. As shown in FIG. 2, each first recessed groove 115 extends either in the first direction x or in the second direction y. The semiconductor device A10 includes two first recessed grooves 115 extending in the first direction x, and three first recessed grooves 115 extending in the second direction y. The two first recessed grooves 115 extending in the first direction x are located between the control element 41 and the first through holes 114 in the second direction y. The two first recessed grooves 115 are arrayed in the first direction x. The three first recessed grooves 115 extending in the second direction y are located between the control element 41 and the insulating element 50 in the first direction x. The three first recessed grooves 115 are arrayed in the second direction y. As viewed in the thickness direction z, the four sides of the insulating element 50 are surrounded by the first edge 111, the third edge 112, the fifth edge 113 and the three first recessed grooves 115.

As shown in FIG. 2, the second pad portion 21 additionally has a fourth edge 212, a sixth edge 213, a plurality of second through holes 214 and a plurality of second recessed grooves 215.

As shown in FIG. 2 viewed in the thickness direction z, the fourth edge 212 includes a segment extending in the first direction x. The fourth edge 212 is connected to one of the third end 211A and the fourth end 211B of the second edge 211 that is located between the first end 111A and the second end 111B of the first edge 111 of the first pad portion 11 in the second direction y. In the semiconductor device A10, the fourth edge 212 is connected to the fourth end 211B. As shown in FIG. 5, the fourth edge 212 has a fourth-edge connecting portion 212A. The fourth-edge connecting portion 212A is connected to one of the third end 211A and the fourth end 211B. In the semiconductor device A10, the fourth-edge connecting portion 212A is connected to the fourth end 211B. The fourth-edge connecting portion 212A is convex toward the outside of the second pad portion 21. The fourth-edge connecting portion 212A defines an arc. The fourth-edge connecting portion 212A has a radius of curvature R2$a$ that is equal to the radius of curvature R1$a$ of the third-edge connecting portion 112A of the third edge 112 shown in FIG. 4.

As shown in FIG. 2 viewed in the thickness direction z, the sixth edge 213 is spaced apart from the fourth edge 212 in the second direction y and connected to the second edge 211. In the semiconductor device A10, the sixth edge 213 is connected to the third end 211A of the second edge 211. The sixth edge 213 includes a segment extending in the first direction x. As shown in FIG. 4, the sixth edge 213 has a sixth-edge connecting portion 213A. In the semiconductor device A10, the sixth-edge connecting portion 213A is connected to the third end 211A. The sixth-edge connecting portion 213A is convex toward the outside of the second pad portion 21. The sixth-edge connecting portion 213A defines an arc. The sixth-edge connecting portion 213A has a radius of curvature R2$b$ that is smaller than the radius of curvature R2$a$ of the fourth-edge connecting portion 212A of the fourth edge 212 shown in FIG. 5.

Referring to FIG. 2, the second through holes 214 are located near the boundary between the second pad portion 21 and the second terminal portion 22 (to be detailed later) and spaced apart from the driver element 42 in the second direction y, as viewed in the thickness direction z. Each second through holes 214 extends through the second pad portion 21 in the thickness direction z. The second through holes 214 are arrayed in the first direction x.

Figure 13:
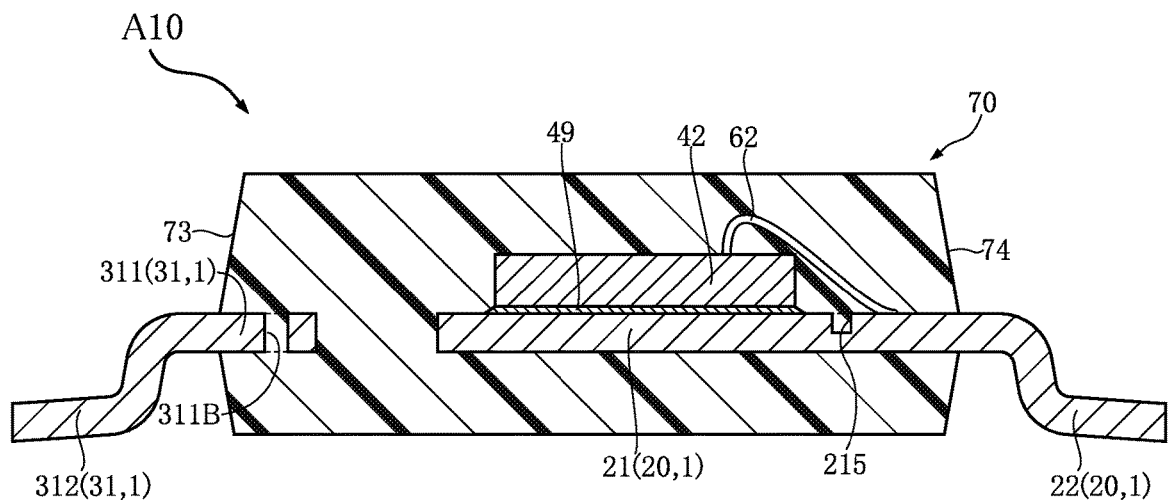
FIG. 13 is a sectional view taken along line XIII-XIII of FIG. 2.

As shown in FIG. 13, the second recessed grooves 215 are recessed from the surface of the first terminal portion 22 on which the driver element 42 is mounted. As shown in FIG. 2, each second recessed groove 215 extends in the first direction x. The second recessed grooves 215 are located between the driver element 42 and the second through hole 214 in the second direction y. The second recessed grooves 215 are arrayed in the first direction x.

Figure 9:
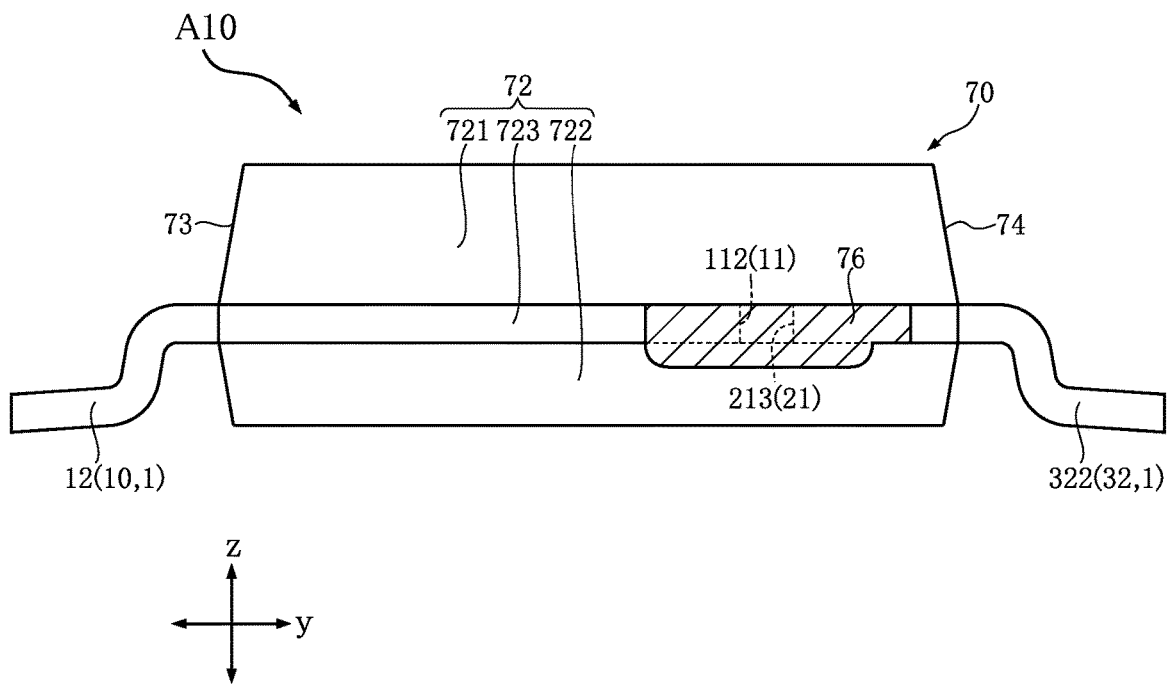
FIG. 9 is a front view of the semiconductor device of FIG. 1.

As shown in FIG. 2, the first lead 10 additionally has the first terminal portion 12. The first terminal portion 12 is connected to the first pad portion 11 in the second direction y and exposed from the sealing resin 70. The first terminal portion 12 is the ground terminal of a source voltage for driving the control element 41. As viewed in the thickness direction z, the first terminal portion 12 has a strip shape extending in the second direction y. As shown in FIG. 9, the first terminal portion 12 is bent to define a gull-wing shape as viewed in the first direction x. The first terminal portion 12 is coated with a tin (Sn) layer.

Figure 8:
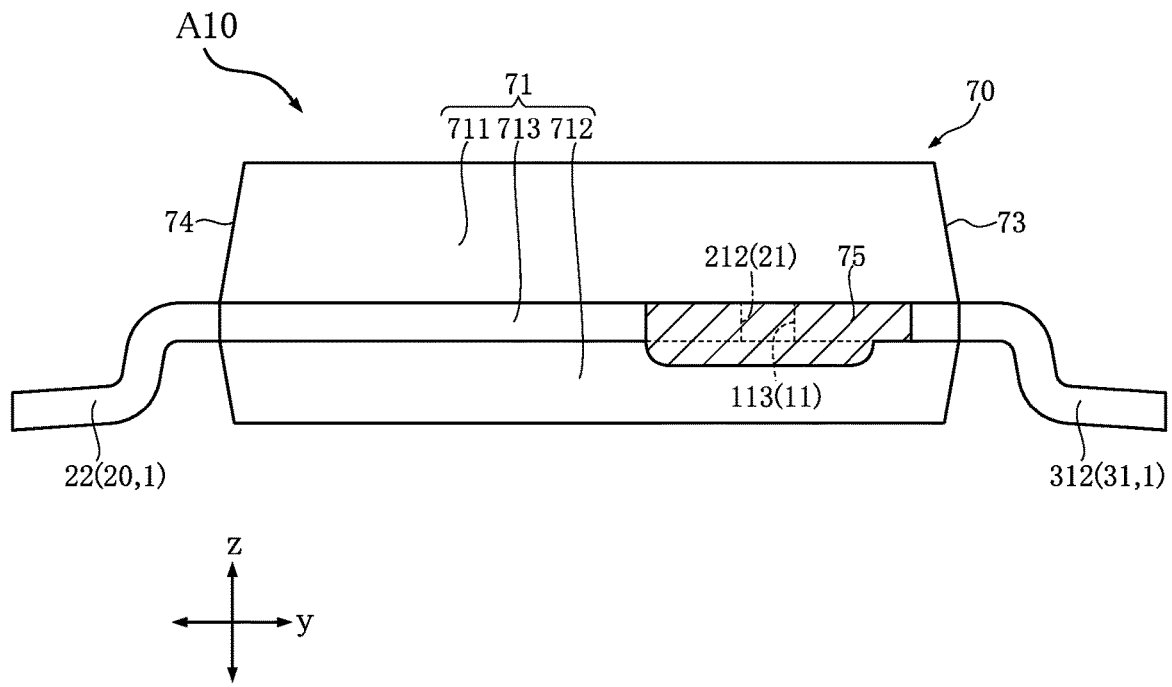
FIG. 8 is a rear view of the semiconductor device of FIG. 1.

As shown in FIG. 2, the second lead 20 additionally has the second terminal portion 22. The second terminal portion 22 is connected to the second pad portion 21 in the second direction y and exposed from the sealing resin 70. The second terminal portion 22 is the ground terminal of a source voltage for driving the driver element 42. The second terminal portion 22 is electrically connected to the emitter electrode of the switching element driven by the semiconductor device A10. As viewed in the thickness direction z, the second terminal portion 22 has a strip shape extending in the second direction y. As viewed in the thickness direction z, the second terminal portion 22 extends out of the sealing resin 70 in the opposite direction to the direction in which the first terminal portion 12 extends out of the sealing resin 70. As shown in FIG. 8, the second terminal portion 22 is bent to define a gull-wing shape as viewed in the first direction x. The second terminal portion 22 is coated with a tin coating.

As shown in FIG. 2, the third lead 31 has a third pad portion 311 and a third terminal portion 312.

As shown in FIG. 2, the third pad portion 311 is adjacent to the fourth edge 212 of the second pad portion 21 in the second direction y. The third pad portion 311 is electrically connected to the control element 41 via one of the first wires 61. The third pad portion 311 is covered by the sealing resin 70. The third pad portion 311 extends from the third terminal portion 312 toward the first pad portion 11. Most surface of the third pad portion 311 is coated with a metal layer, such as a silver coating. The third pad portion 311 has a third-pad proximate edge 311A and a plurality of third through holes 311B.

Figure 6:
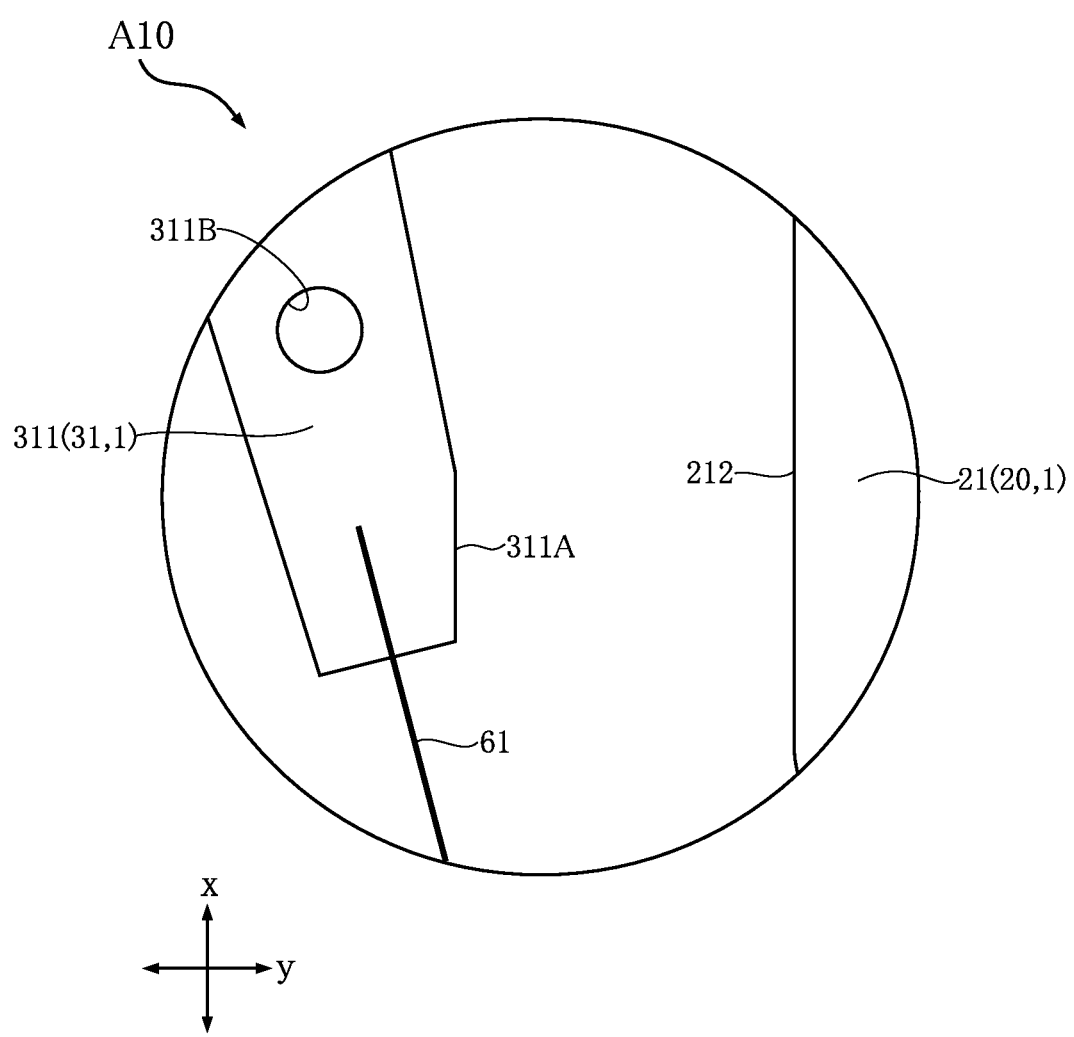
FIG. 6 is an enlarged view showing a part of FIG. 2.

Referring to FIG. 6, as viewed in the thickness direction z, the third-pad proximate edge 311A is the nearest edge to the fourth edge 212 of the second pad portion 21. The third-pad proximate edge 311A extends in the first direction x, and hence the third-pad proximate edge 311A is parallel to the fourth edge 212. As shown in FIG. 13, each third through hole 311B extends through the third pad portion 311 in the thickness direction z.

As shown in FIG. 2, the third terminal portion 312 is connected to the third pad portion 311 in the second direction y and exposed from the sealing resin 70. The third terminal portion 312 is the positive electrode of a source voltage for driving the control element 41. As viewed in the thickness direction z, the third terminal portion 312 has a strip shape extending in the second direction y. As viewed in the thickness direction z, the third terminal portion 312 extends out of the sealing resin 70 in the same direction as the first terminal portion 12 extending out of the sealing resin 70. As shown in FIG. 8, the third terminal portion 312 is bent to define a gull-wing shape as viewed in the first direction x. The third terminal portion 312 is coated with a tin coating.

As shown in FIG. 2, the fourth lead 32 has a fourth pad portion 321 and a fourth terminal portion 322.

As shown in FIG. 2, the fourth pad portion 321 is adjacent to the third edge 112 of the first pad portion 11 in the second direction y. The fourth pad portion 321 is electrically connected to the driver element 42 via one of the second wires 62. The fourth pad portion 321 is covered by the sealing resin 70. The fourth pad portion 321 extends from the fourth terminal portion 322 toward the second pad portion 21. Most surface of the fourth pad portion 321 is coated with a metal layer, such as a silver coating. The fourth pad portion 321 has a fourth-pad proximate edge 321A and a plurality of fourth through holes 321B.

Figure 7:
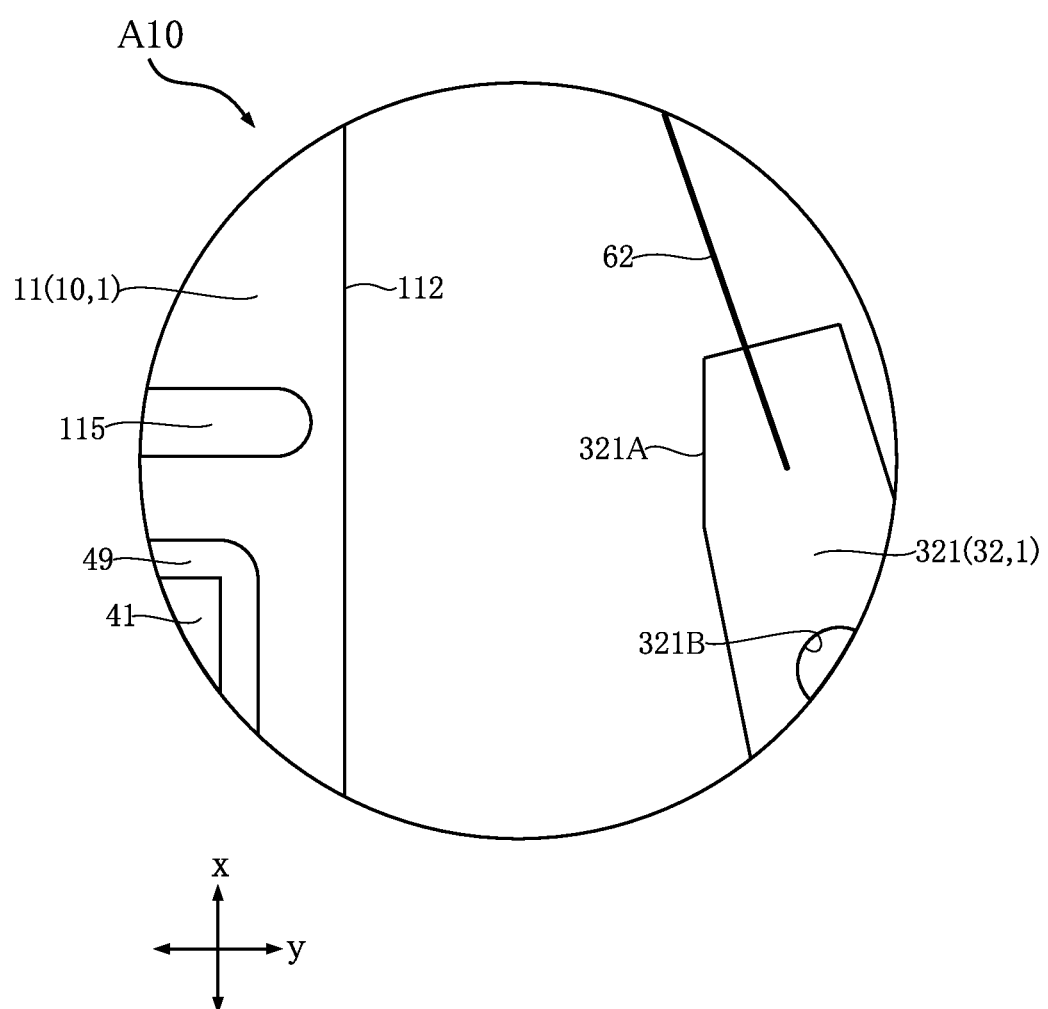
FIG. 7 is an enlarged view showing a part of FIG. 2.

Referring to FIG. 7, as viewed in the thickness direction z, the fourth-pad proximate edge 321A is the nearest edge to the third edge 112 of the first pad portion 11. The fourth-pad proximate edge 321A extends in the first direction x, and hence the fourth-pad proximate edge 321A is parallel to the third edge 112. As shown in FIG. 12, each fourth through hole 321B extends through the fourth pad portion 321 in the thickness direction z.

As shown in FIG. 2, the fourth terminal portion 322 is connected to the fourth pad portion 321 in the second direction y and exposed from the sealing resin 70. The source voltage for driving the driver element 42 is applied to the fourth terminal portion 322. As viewed in the thickness direction z, the fourth terminal portion 322 has a strip shape extending in the second direction y. As viewed in the thickness direction z, the fourth terminal portion 322 extends out of the sealing resin 70 in the same direction as the second terminal portion 22 extending out of the sealing resin 70. As shown in FIG. 9, the fourth terminal portion 322 is bent to define a gull-wing shape as viewed in the first direction x. The fourth terminal portion 322 is coated with a tin coating.

As shown in FIG. 2, the fifth leads 33 are next to each other in the first direction x and located between the first lead 10 and the third lead 31 in the first direction x. The semiconductor device A10 of this example has two fifth leads 33. Each fifth lead 33 has a fifth pad portion 331 and a fifth terminal portion 332.

As shown in FIG. 2, the fifth pad portions 331 are electrically connected to the control element 41 each via one of the first wires 61. The fifth pad portions 331 are covered by the sealing resin 70. Most surface of the fifth pad portions 331 is coated with a metal layer, such as a silver coating. Each fifth pad portion 331 has a fifth through hole 331A. As shown in FIG. 14, the fifth through hole 331A extends through the fifth pad portion 331 in the thickness direction z.

As shown in FIG. 2, the fifth terminal portions 332 are connected to the respective fifth pad portions 331 in the second direction y and exposed from the sealing resin 70. The fifth terminal portions 332 are located between the first terminal portion 12 and the third terminal portion 312. The fifth terminal portions 332 of the fifth leads 33 receive two different pulse signals. Those pulse signals are generated from a pulse width modulation (PWM) signal serving as the base for driving the switching element. As viewed in the thickness direction z, the fifth terminal portions 332 have a strip shape extending in the second direction y. As viewed in the thickness direction z, the fifth terminal portions 332 extend out of the sealing resin 70 in the same direction as the first terminal portion 12 and the third terminal portion 312 extending out of the sealing resin 70. As shown in FIG. 14, each fifth terminal portion 332 is bent to define a gull-wing shape as viewed in the first direction x. The fifth terminal portions 332 are coated with a tin coating.

As shown in FIG. 2, the sixth leads 34 are next to each other in the first direction x and located between the second lead 20 and the fourth lead 32 in the first direction x. The sixth leads 34 are spaced apart from the fifth leads 33 in the second direction y. The semiconductor device A10 of this example has two sixth leads 34. Each sixth lead 34 has a sixth pad portion 341 and a sixth terminal portion 342.

As shown in FIG. 2, the sixth pad portions 341 are electrically connected to the driver element 42 each via one of the second wires 62. The sixth pad portions 341 are covered by the sealing resin 70. Most surface of the sixth pad portions 341 is coated with a metal layer, such as a silver coating. Each sixth pad portion 341 has a sixth through hole 341A. As shown in FIG. 14, the sixth through hole 341A extends through the sixth pad portion 341 in the thickness direction z.

As shown in FIG. 2, the sixth terminal portions 342 are connected to the respective sixth pad portion 341 in the second direction y and exposed from the sealing resin 70. The sixth terminal portions 342 are located between the second terminal portion 22 and the fourth terminal portion 322. The sixth terminal portions 342 of the sixth lead s34 receive a gate voltage for driving the switching elements. One of the sixth leads 34 is electrically connected at the sixth terminal portion 342 to the gate electrode of the switching element constituting an upper arm circuit (high-side section). Another of the sixth leads 34 is electrically connected at the sixth terminal portion 342 to the switching element constituting a lower arm circuit (low-side section). As viewed in the thickness direction z, the sixth terminal portions 342 have a strip shape extending in the second direction y. As viewed in the thickness direction z, the sixth terminal portions 342 extend out of the sealing resin 70 in the same direction as the second terminal portion 22 and the fourth terminal portion 322 extending out of the sealing resin 70. As shown in FIG. 14, each sixth terminal portion 342 is bent to define a gull-wing shape as viewed in the first direction x. The sixth terminal portion 342 are coated with a tin coating.

Next, with reference to FIG. 3, the lead frame 80 used for fabricating the semiconductor device A10 will be described.

The portion of the lead frame 80 shown in FIG. 3 includes the conductive support member 1 (the first lead 10, the second lead 20, the third lead 31, the fourth lead 32, the fifth leads 33 and the sixth leads 34), which is a component of the semiconductor device A10. In addition to the conductive support member 1, the lead frame 80 includes a frame 81, a plurality of first tie bars 821, a plurality of second tie bars 822 and a pair of dam bars 83.

As viewed in the thickness direction z, the frame 81 has a rectangular shape. The frame 81 surrounds the conductive support member 1, the first tie bars 821, the second tie bars 822 and the dam bars 83. The opposite ends of the conductive support member 1 in the first direction x are connected to the frame 81.

The first tie bars 821 extend in the first direction x. The semiconductor device A10 of this example has two first tie bars 821 on one side of the first pad portion 11 and the second pad portion 21, and two more tie bars 821 on the other side. The first tie bars 821 intersect the first terminal portion 12, the second terminal portion 22, the third terminal portion 312, the fourth terminal portion 322, the fifth terminal portions 332 of the fifth leads 33 and the sixth terminal portions 342 of the sixth leads 34.

The second tie bars 822 extend in the second direction y. The semiconductor device A10 of this example has four second tie bars 822. Each two adjacent first tie bars 821 are connected to each other at one of their ends in the first direction x by one of the second tie bars 822. Each second tie bar 822 is connected at an end in the second direction y to one of the dam bars 83.

The pair of dam bars 83 are on the opposite sides of the lead frame 80 in the first direction x. Each dam bar 83 is connected to the frame 81 at their opposite ends in the second direction y. Each dam bar 83 has a cutaway portion 831 recessed in the first direction x. In the manufacture of the semiconductor device A10, the cutaway portions 831 are used to form gates through which synthetic resin flows in and out for forming a sealing resin 70 by molding.

The imaginary lines of FIG. 3 indicate the outer edges of the sealing resin 70 as viewed in the thickness direction z. The conductive support member 1 as viewed in the thickness direction z extends beyond the opposite edges of the sealing resin in the second direction y. In contrast, as viewed in the thickness direction z, the region of the lead frame 80 corresponding to the conductive support member 1 does not extend beyond the opposite edges of the sealing resin 70 in the first direction x.

As shown in FIGS. 2 and 15, the control element 41 is a semiconductor element mounted on the first pad portion 11. As viewed in the thickness direction z, the control element 41 has a rectangular shape elongated in the second direction y. The control element 41 is provided with a plurality of electrodes 411 on its upper surface. The electrodes 411 include one connected to the first pad portion 11, one connected to the third pad portion 311, and ones connected to the fifth pad portions 331, each via one of the first wires 61. The first wires 61 are made of gold (Au), for example.

As viewed in the thickness direction z, the first wire 61 that is connected to the third pad portion 311 is offset outward from the insulating element 50. The control element 41 is disposed on the first pad portion 11 via a bonding layer 49. The bonding layer 49 may be formed from a silver paste containing an epoxy resin as a base component. The control element 41 is bonded to the first pad portion 11 by the bonding layer 49.

As shown in FIGS. 2 and 15, the driver element 42 is a semiconductor element mounted on the second pad portion 21. As viewed in the thickness direction z, the driver element 42 has a rectangular shape elongated the second direction y. The driver element 42 is provided with a plurality of electrodes 421 on its upper surface. The electrodes 421 include one connected to the second pad portion 21, one connected to the fourth pad portion 321 and ones connected to the sixth pad portions 341, each via one of the second wires 62. The second wire 62 are made of gold, for example. As viewed in the thickness direction z, the second wire 62 that is connected to the fourth pad portion 321 extends across a region between the third edge 112 of the first pad portion 11 and an extended line of the sixth edge 213 of the second pad portion 21 in the second direction y. The driver element 42 is disposed on the second pad portion 21 via a bonding layer 49. The driver element 42 is bonded to the second pad portion 21 by the bonding layer 49.

As shown in FIGS. 2 and 15, the insulating element 50 is a semiconductor element mounted on the first pad portion 11 and adjacent to the control element 41. As viewed in the thickness direction z, the insulating element 50 is located between the control element 41 and the driver element 42 in the first direction x. As viewed in the thickness direction z, the insulating element 50 has a rectangular shape elongated the second direction y. The insulating element 50 is provided with a plurality of low-voltage electrodes 53 and a plurality of high-voltage electrodes 54 on its upper surface. Each low-voltage electrode 53 is connected to one of the electrodes 411 of the control element 41 via a third wire 63. Each high-voltage electrode 54 is connected to one of the electrodes 421 of the driver element 42 via a fourth wire 64. The third wire 63 and the fourth wires 64 are made of gold, for example. The insulating element 50 is disposed on the first pad portion 11 via a bonding layer 49. The insulating element 50 is bonded to the first pad portion 11 by the bonding layer 49.

As shown in FIGS. 12 to 15, the sealing resin 70 covers the control element 41, the driver element 42, the insulating element 50, the first wires 61, the second wires 62, the third wires 63 and the fourth wires 64. The sealing resin 70 is made of a material containing epoxy resin, for example. As shown in FIGS. 8 to 11, the sealing resin 70 has a first side surface 71, a second side surface 72, a third side surface 73 and a fourth side surface 74.

As shown in FIG. 2, the first side surface 71 and the second side surface 72 are spaced apart from each other in the first direction x. The first side surface 71 is adjacent to the second pad portion 21 and the third pad portion 311. The second side surface 72 is adjacent to the first pad portion 11 and the fourth pad portion 321. As shown in FIGS. 2, 8 and 9, the conductive support member 1 is not exposed on either the first side surface 71 or the second side surface 72.

Figure 11:
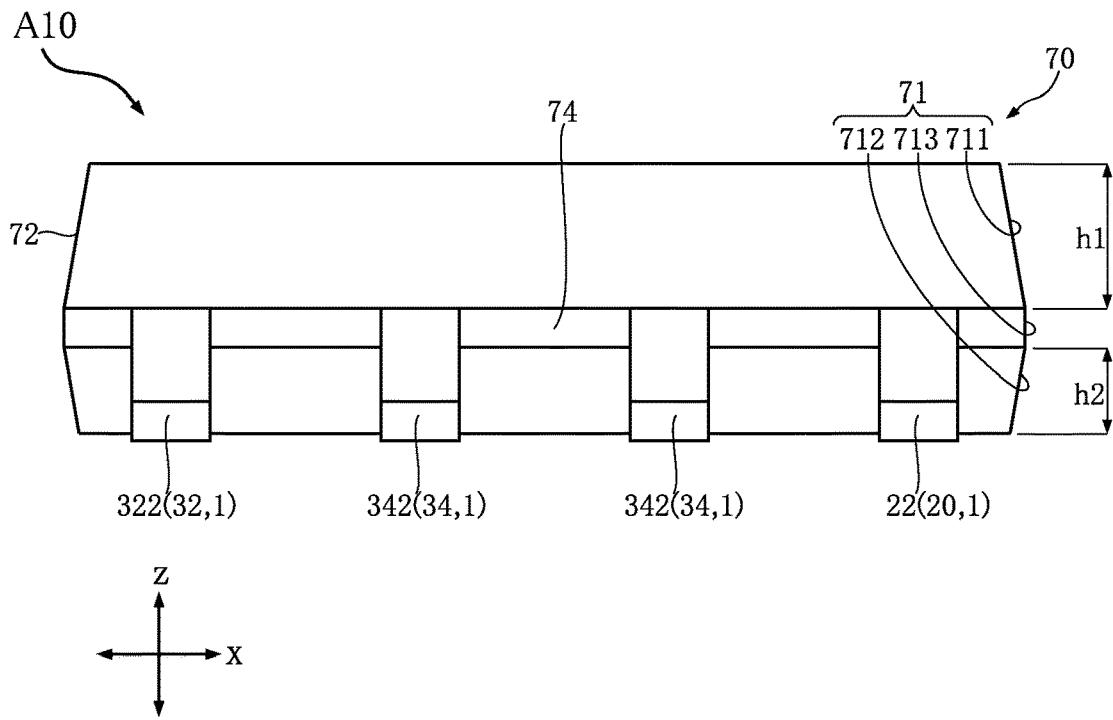
FIG. 11 is a right-side view of the semiconductor device of FIG. 1.

As shown in FIGS. 8 and 11, the first side surface 71 has a first upper portion 711, a first lower portion 712 and a first middle portion 713. The first upper portion 711 is connected to the upper edge of the first middle portion 713 and inclined relative to the thickness direction z toward the second side surface 72. The first lower portion 712 is connected to the lower edge of the first middle portion 713 and inclined relative to the thickness direction z toward the second side surface 72. The first middle portion 713 is parallel to the thickness direction z and has a strip shape extending in the second direction y.

As shown in FIG. 8, the first side surface 71 has a first gate mark 75 that is partly on the first middle portion 713 and partly on the first lower portion 712. The first gate mark 75 has a higher surface roughness than the rest of the first side surface 71. The first gate mark 75 is formed as a result that synthetic resin flows in and out during the molding of the sealing resin 70. As shown in FIG. 2 viewed in the thickness direction z, the first gate mark 75 includes a region lying between an extended line of the fourth edge 212 of the second pad portion 21 and an extended line of the fifth edge 113 of the first pad portion 11 in the second direction y.

Figure 10:
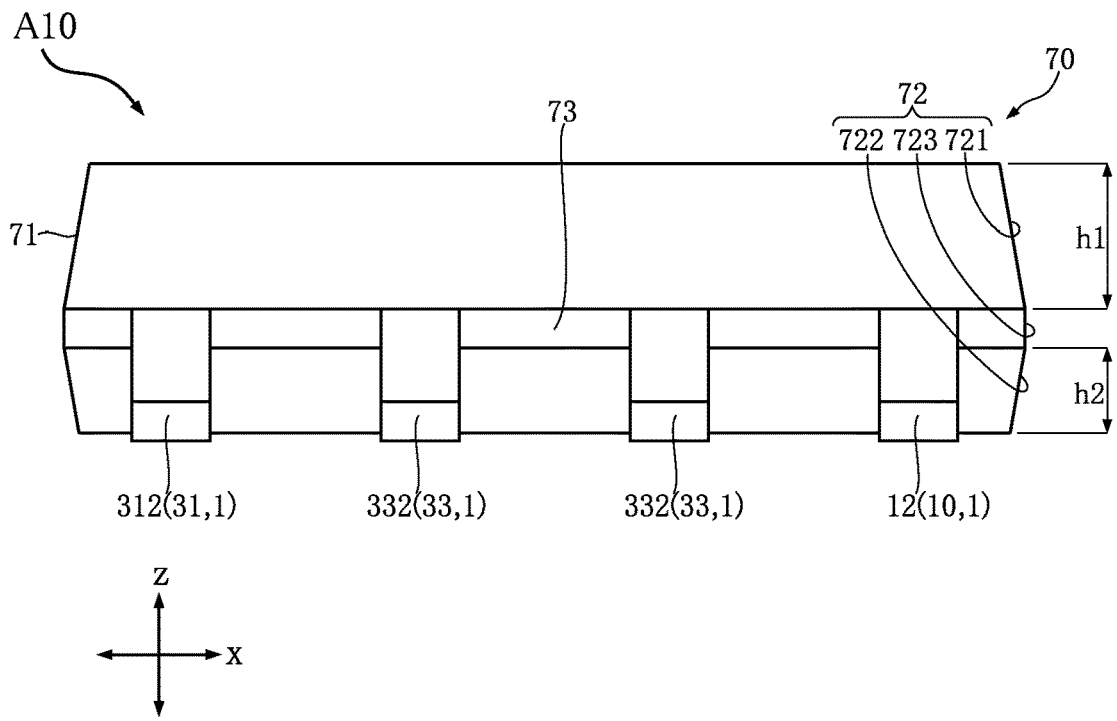
FIG. 10 is a left-side view of the semiconductor device of FIG. 1.

As shown in FIGS. 9 and 10, the second side surface 72 has a second upper portion 721, a second lower portion 722 and a second middle portion 723. The second upper portion 721 is connected to the upper edge of the second middle portion 723 and inclined relative to the thickness direction z toward the first side surface 71. The second lower portion 722 is connected to the lower edge of the second middle portion 723 and inclined relative to the thickness direction z toward the first side surface 71. The second middle portion 723 is parallel to the thickness direction z and has a strip shape extending in the second direction y.

As shown in FIG. 9, the second side surface 72 has a second gate mark 76 that is partly on the second middle portion 723 and partly on the second lower portion 722. The second gate mark 76 has a higher surface roughness than other regions of the second side surface 72. Similarly to the first gate mark 75, the second gate mark 76 is formed as a result that synthetic resin flows in and out during the molding of the sealing resin 70. As shown in FIG. 2 viewed in the thickness direction z, the second gate mark 76 includes a region lying between an extended line of the third edge 112 of the first pad portion 11 and an extended line of the sixth edge 213 of the second pad portion 21 in the second direction y. The first gate mark 75 and the second gate mark 76 are spaced apart from each other in the second direction y.

As shown in FIGS. 10 and 11, the first upper portion 711 of the first side surface 71 and the second upper portion 721 of the second side surface 72 have a height h1 that is greater than the height h2 of the first lower portion 712 of the first side surface 71 and the second lower portion 722 of the second side surface 72. The heights h1 and h2 are dimensions measured in the thickness direction z.

As shown in FIG. 2, the third side surface 73 and the fourth side surface 74 are spaced apart from each other in the second direction y. Each of the third side surface 73 and the fourth side surface 74 is connected at their ends in the first direction x to the first side surface 71 and the second side surface 72. As shown in FIGS. 2 and 10, the first terminal portion 12, the third terminal portion 312 and the fifth terminal portions 332 of the fifth leads 33 are exposed from the third side surface 73. As shown in FIGS. 2 and 11, the second terminal portion 22, the fourth terminal portion 322 and the sixth terminal portions 342 of the sixth leads 34 are exposed from the fourth side surface 74.

Next, with reference to FIGS. 16 to 20, the internal structure of the insulating element 50 is described. The insulating element 50 includes a semiconductor substrate 51, a plurality of insulating layers 52, a plurality of low-voltage electrodes 53, a plurality of high-voltage electrodes 54, a plurality of coils 55, a plurality of low-voltage wirings 56, a plurality of high-voltage wirings 57, a shield layer 58 and a protective film 59. In the semiconductor device A10 of this example, the low-voltage electrodes 53 includes a pair of first electrodes 531 and a second electrode 532. The high-voltage electrodes 54 includes a pair of third electrodes 541 and a fourth electrode 542. Unless otherwise specified, the upper and lower directions used in the description of the internal structure of the insulating element 50 refer to the upper and lower directions in the thickness direction z.

Figure 19:
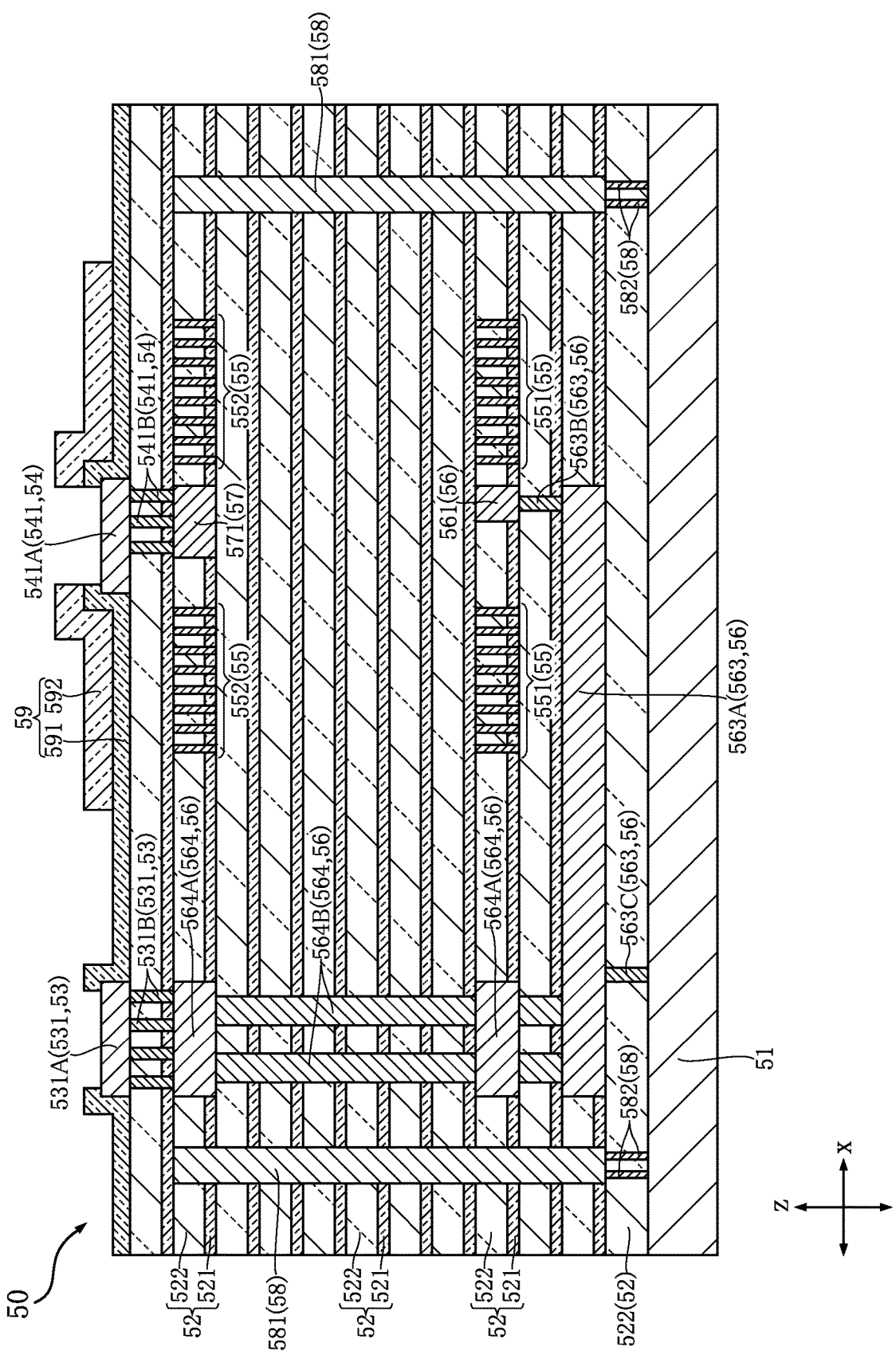
FIG. 19 is a sectional view taken along line XIX-XIX of FIG. 16.
Figure 20:
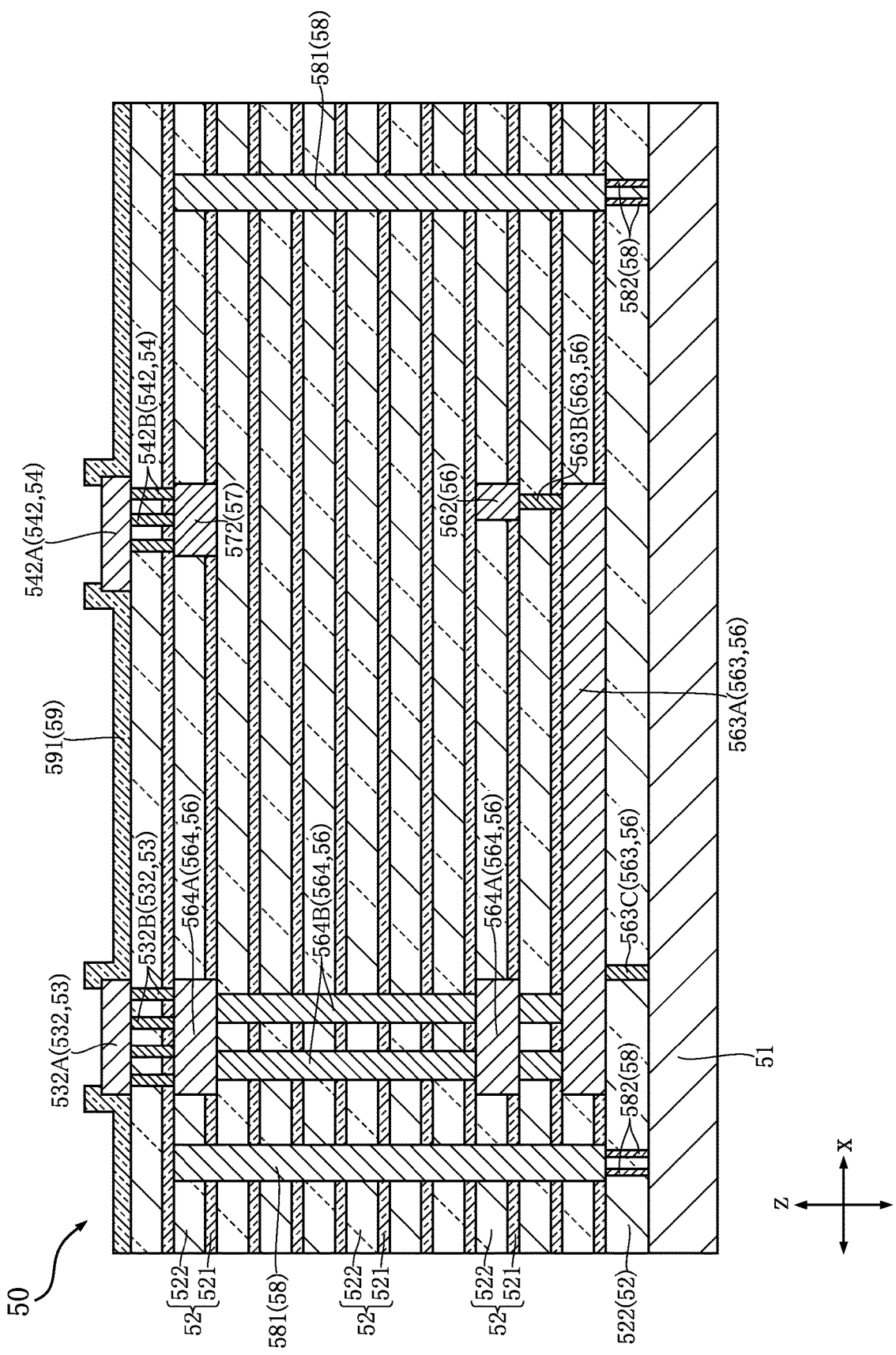
FIG. 20 is a sectional view taken along line XX-XX of FIG. 16.

As shown in FIGS. 19 and 20, the semiconductor substrate 51 is located at the bottom of the insulating element 50. The semiconductor substrate 51 is made of silicon (Si) or silicon carbide (SiC).

As shown in FIGS. 19 and 20, the insulating layers 52 are electrically insulative and stacked on the semiconductor substrate 51. The semiconductor device A10 of this example includes 12 insulating layers 52. The number of insulating layers 52 is not limited to this, and any number of insulating layers may be provided, depending on the dielectric strength required for the insulating element 50. In the following description, the fifth insulating layer 52 refers to the fifth one of the insulating layers 52, counted from the semiconductor substrate 51 in the thickness direction z. The same description applies to the other insulating layers 52. The first insulating layer 52 is formed of an interlayer film 522. The interlayer film 522 may be made from silicon dioxide ($SiO_2$). The other insulating layers 52 (the second to twelfth layers) are each formed of an etching stopper film 521 and an interlayer film 522. In each insulating layer 52, the etching stopper film 521 is located below the interlayer film 522. Each etching stopper film 521 is in contact with the interlayer film 522 of the insulating layer 52 directly therebelow. The etching stopper films 521 are made from silicon nitride ($Si_3N_4$) or silicon carbide, for example.

As shown in FIGS. 17 to 20, the coils 55 are disposed within the insulating layers 52. The coils 55 include a plurality of pairs, each made up of a lower coil 551 and an upper coil 552. The semiconductor device A10 of this example includes two pairs of coils 55. That is, in the semiconductor device A10 of this example, the coils 55 include two lower coils 551 and two upper coils 552. The lower coils 551 are located below the upper coils 552. In the thickness direction z, the lower coils 551 are separated from the upper coils 552 by the plurality of insulating layers 52. In the semiconductor device A10 of this example, the lower coils 551 are disposed within the fourth insulating layer 52, and the upper coils 552 are disposed within the eleventh insulating layer 52. As viewed in the thickness direction z, the two lower coils 551 overlap with the respective upper coils 552.

As viewed in the thickness direction z, each coil 55 is an oval shaped spiral. Each coil 55 extends in the thickness direction z through the corresponding insulating layer 52. Each coil 55 is made of a conductive layer and a barrier metal layer. The conductive layer may be made of copper. The barrier metal layer covers the surface of the conductive layer (except the upper end of the conductive layer). In one example, the barrier metal layer includes a tantalum (Ta) layer, a tantalum nitride (TaN) layer, and another tantalum layer that are stacked in sequence on the conductive layer.

The low-voltage wirings 56 provide conductive paths between the lower coils 551 and the low-voltage electrodes 53. Each low-voltage wiring 56 is made of a conductive layer and a barrier metal layer, which are the same as those used in the coils 55. As shown in FIG. 16, the low-voltage electrodes 53 includes a pair of first electrodes 531 and a second electrode 532. The second electrode 532 is located between the first electrodes 531 in the second direction y.

From among the plurality of low-voltage wirings 56, the following describes a pair of low-voltage wirings 56 that electrically connect the lower coils 551 to the first electrodes 531. Each low-voltage wiring 56 in the pair includes a lower-coil inner-end wiring 561, a lead-in wiring 563 and a via wiring 564 as components.

As shown in FIG. 18 viewed in the thickness direction z, the lower-coil inner-end wiring 561 extends in the second direction y and surrounded by the inner edge of the lower coil 551. The lower-coil inner-end wiring 561 has an end in the second direction y connected to the inner end of the lower coil 551. As shown in FIG. 19, the lower-coil inner-end wiring 561 is disposed within the same fourth insulating layer 52 as the lower coil 551 that surrounds the lower-coil inner-end wiring 561.

As shown in FIGS. 18 and 19, the lead-in wiring 563 is connected to the lower-coil inner-end wiring 561 and extends in the first direction x to the via wiring 564. The lead-in wiring 563 has a main portion 563A, a connecting portion 563B and a grounding portion 563C. The main portion 563A is disposed within the second insulating layer 52 and extends in the first direction x. The connecting portion 563B is disposed within the third insulating layer 52 and electrically connects the main portion 563A to the lower-coil inner-end wiring 561. The grounding portion 563C is disposed within the first insulating layer 52 and electrically connects the main portion 563A to the semiconductor substrate 51.

As shown in FIG. 19, the via wiring 564 extends in the thickness direction z. The via wiring 564 is connected to the lead-in wiring 563. The via wiring 564 includes a pair of strip portions 564A and a plurality of pillar portions 564B. Each strip portion 564A extends in the second direction y. One of the strip portions 564A is disposed within the same fourth insulating layer 52 as the lower coils 551. The other strip portion 564A is disposed above the lower strip portion 564A within the same eleventh insulating layer 52 as the upper coils 552. As viewed in the thickness direction z, the pair of strip portions 564A overlap with each other. The pillar portions 564B connect the main portion 563A of the lead-in wiring 563 and the pair of strip portions 564A. The pillar portions 564B extend through the third insulating layer 52 and also through the fifth to tenth insulating layers 52. The lower ends of the pillar portions 564B are connected to the upper end of the main portion 563A. The upper ends of the pillar portions 564B are connected to the lower end of the upper one of the second strip portions 564A. The upper second strip portion 564A is connected at its upper end to a first electrode 531.

From among the plurality of low-voltage wirings 56, the following describes the low-voltage wiring 56 that electrically connects the two lower coils 551 to the second electrode 532. This low-voltage wiring 56 includes a lower-coil outer-end wiring 562, a lead-in wiring 563 and a via wiring 564 as components. The lead-in wiring 563 and the via wiring 564 of this low-voltage wiring 56 are similar to those of the low-voltage wirings 56 connecting the lower coils 551 to the first electrodes 531, so that a description thereof is omitted.

Referring to FIG. 18, as viewed in the thickness direction z, the lower-coil outer-end wiring 562 extends in the second direction y and located between the two lower coils 551 in the second direction y. The lower-coil outer-end wiring 562 has ends in the second direction y connected to the respective outer ends of the lower coils 551. As shown in FIG. 20, the lower-coil outer-end wiring 562 is disposed within the same fourth insulating layer 52 as the lower coils 551. As shown in FIG. 20, the second electrode 532 is connected to the upper end of the strip portion 564A of the via wiring 564 disposed within the eleventh insulating layer 52.

The high-voltage wirings 57 provides conductive paths between the upper coils 552 and the high-voltage electrodes 54. Each high-voltage wiring 57 is made of a conductive layer and a barrier metal layer, which are the same as those used in the coils 55. As shown in FIG. 16, the high-voltage electrodes 54 include a pair of third electrodes 541 and a fourth electrode 542. The fourth electrode 542 is located between the third electrodes 541 in the second direction y.

From among the plurality of high-voltage wirings 57, the following describes a pair of high-voltage wirings 57 that electrically connect the upper coils 552 to the third electrodes 541. Each high-voltage wiring 57 in the pair includes an upper-coil inner-end wiring 571 as a component. As shown in FIG. 17 viewed in the thickness direction z, the upper-coil inner-end wiring 571 extends in the second direction y and surrounded by the inner edge of the upper coil 552. The upper-coil inner-end wiring 571 has an end in the second direction y connected to the inner end of the upper coil 552. As shown in FIG. 19, the upper-coil inner-end wiring 571 is disposed within the same eleventh insulating layer 52 as the upper coil 552 surrounding that upper-coil inner-end wiring 571. The upper-coil inner-end wiring 571 is connected at its upper end to a third electrode 541.

From among the plurality of high-voltage wirings 57, the following describes the high-voltage wiring 57 that electrically connects the two upper coils 552 to the fourth electrode 542. This high-voltage wiring 57 includes an upper-coil outer-end wiring 572 as a component. As shown in FIG. 17 viewed in the thickness direction z, the upper-coil outer-end wiring 572 extends in the second direction y and located between the pair of upper coils 552 in the second direction y. The upper-coil outer-end wiring 572 has ends in the second direction y connected to the respective outer ends of the upper coils 552. As shown in FIG. 20, the upper-coil outer-end wiring 572 is disposed within the same eleventh insulating layer 52 as the upper coils 552. The upper-coil outer-end wiring 572 is connected at its upper end to the fourth electrode 542.

Referring to FIG. 16, as viewed in the thickness direction z, the low-voltage electrodes 53 are spaced apart from the coils 55 in the first direction x.

As shown in FIG. 19, each first electrode 531, which is a low-voltage electrode 53, has a pad portion 531A and a plurality of connecting portions 531B. As shown in FIG. 16, the pad portion 531A has two regions separated in the second direction y, and one of the third wires 63 is connected to one of the two regions. The pad portion 531A is disposed on the topmost insulating layer 52. The pad portion 531A may be made of aluminum (Al). The connecting portions 531B extend in the thickness direction z from the lower end of the pad portion 531A. The connecting portions 531B are disposed within the twelfth insulating layer 52. The connecting portions 531B are composed of a conductive layer and a barrier metal layer, which are the same as those used in the coils 55. The connecting portions 531B are connected at their lower ends to the strip portion 564A (disposed within the eleventh insulating layer 52) of the via wiring 564 that is electrically connected to the lower-coil inner-end wiring 561.

As shown in FIG. 20, the second electrode 532, which is a low-voltage electrode 53, has a pad portion 532A and a plurality of connecting portions 532B. As shown in FIG. 16, the pad portion 532A has two regions separated in the second direction y, and one of the third wires 63 is connected to one of the two regions. The pad portion 532A is disposed on the topmost insulating layer 52. The pad portion 532A may be made of aluminum. The connecting portions 532B extend in the thickness direction z from the lower end of the pad portion 532A. The connecting portions 532B are disposed within the twelfth insulating layer 52. The connecting portions 532B are composed of a conductive layer and a barrier metal layer, which are the same as those used in the coils 55. The connecting portions 532B are connected at their lower ends to the strip portion 564A (disposed within the eleventh insulating layer 52) of the via wiring 564 that is electrically connected to the lower-coil outer-end wiring 562.

As shown in FIG. 17, each high-voltage electrode 54 has portions overlapping with a high-voltage wiring 57.

As shown in FIG. 19, each third electrode 541, which is a high-voltage electrode 54, has a pad portion 541A and a plurality of connecting portions 541B. As shown in FIG. 16, the pad portion 541A has two regions separated in the second direction y, and one of the fourth wires 64 is connected to one of the two regions. The pad portion 541A is disposed on the topmost insulating layer 52. The pad portion 541A may be made of aluminum. The connecting portions 541B extend in the thickness direction z from the lower end of the pad portion 541A. The connecting portions 541B are disposed within the twelfth insulating layer 52. The connecting portions 541B are composed of a conductive layer and a barrier metal layer, which are the same as those used in the coils 55. The connecting portions 541B are connected at their lower ends to the upper-coil inner-end wiring 571.

As shown in FIG. 20, the fourth electrode 542, which is a high-voltage electrode 54, has a pad portion 542A and a plurality of connecting portions 542B. As shown in FIG. 16, the pad portion 542A has two regions separated in the second direction y, and one of the fourth wires 64 is connected to one of the two regions. The pad portion 542A is disposed on the topmost insulating layer 52. The pad portion 542A may be made of aluminum. The connecting portions 542B extend in the thickness direction z from the lower end of the pad portion 542A. The connecting portions 542B are disposed within the twelfth insulating layer 52. The connecting portions 542B are composed of a conductive layer and a barrier metal layer, which are the same as those used in the coils 55. The connecting portions 542B are connected at their lower ends to the upper-coil outer-end wiring 572.

Referring to FIGS. 16 to 18, as viewed in the thickness direction z, the shield layer 58 has the shape of a frame surrounding the coils 55, the low-voltage wirings 56 and the high-voltage wirings 57. The shield layer 58 is composed of a conductive layer and a barrier metal layer, which are the same as those used in the coils 55. As shown in FIGS. 19 and 20, the shield layer 58 has a frame portion 581 and a plurality of grounding portions 582. The frame portion 581 extends in thickness direction z so as to surround the coils 55, the low-voltage wirings 56 and the high-voltage wirings 57. The frame portion 581 extends from the second to eleventh insulating layers 52. The grounding portions 582 are disposed within the first insulating layer 52 and electrically connect the frame portion 581 to the semiconductor substrate 51.

As shown in FIGS. 19 and 20, the protective film 59 is disposed on the topmost insulating layer 52. The protective film 59 includes a passivation film 591 and a coil protecting film 592. The passivation film 591 covers the topmost insulating layer 52, leaving the low-voltage electrodes 53 and the high-voltage electrodes 54 uncovered. In one example, the passivation film 591 is composed of a silicon dioxide film and a silicon nitride film that are stacked in sequence on the topmost insulating layer 52. The coil protecting film 592 is disposed on the passivation film 591. The coil protecting film 592 are disposed to overlap with the individual coils 55 as viewed in the thickness direction z. The coil protecting film 592 is made of polyimide, for example.

The following describes operations of the control element 41, the driver element 42 and the insulating element 50 included in the semiconductor device A10.

When two different pulse signals are inputted to the fifth terminal portions 332 of the fifth leads 33, the signals are transmitted via the first wires 61 to the control element 41. The two pulse signals are converted by a pair of transistors and a pulse generator included in the control element 41 to one low-voltage pulse signal of five volts (provided that the reference voltage of the control element 41 is zero volt). The resulting low-voltage pulse signal is inputted via the third wires 63 to one of the first electrodes 531 and also to the second electrode 532, all of which are low-voltage electrodes 53.

The low-voltage pulse signal inputted to the first electrode 531 and the second electrode 532 is then passed via the low-voltage wirings 56 to the lower coils 551 and converted into magnetic force. The magnetic force is then converted by the upper coils 552 positioned above the lower coils 551 into a high-voltage pulse signal of 1,215 volts (provided that the reference voltage of the driver element 42 is 1,200 volts). The resulting high-voltage pulse signal is outputted via the high-voltage wirings 57 to one of the third electrodes 541 and also to the fourth electrode 542, all of which are high-voltage electrodes 54.

The high-voltage pulse signal outputted to the third electrode 541 and the fourth electrode 542 are transmitted via the fourth wires 64 to the driver element 42. The high-voltage pulse signal is then converted by the driver element 42 to a gate voltage for driving the switching elements constituting either the upper arm circuit or the lower arm circuit. The gate voltage is then transmitted via one of the second wires 62 to the sixth terminal portion 342 of one of the sixth leads 34 and output therefrom.

As described above, the semiconductor device A10 is divided by the insulating element 50 into a low voltage section having the control element 41 and a high voltage section having the driver element 42. This means that the first lead 10, the third lead 31, the fifth leads 33, the first wires 61 and the third wires 63, all of which are electrically connected to the control element 41, belong to the low voltage section of the semiconductor device A10. Also, the second lead 20, the fourth lead 32, the sixth leads 34, the second wires 62 and the fourth wires 64, all of which are electrically connected to the driver element 42, belong to the high voltage section of the semiconductor device A10.

Next, advantages of the semiconductor device A10 will be described.

Figure 21:
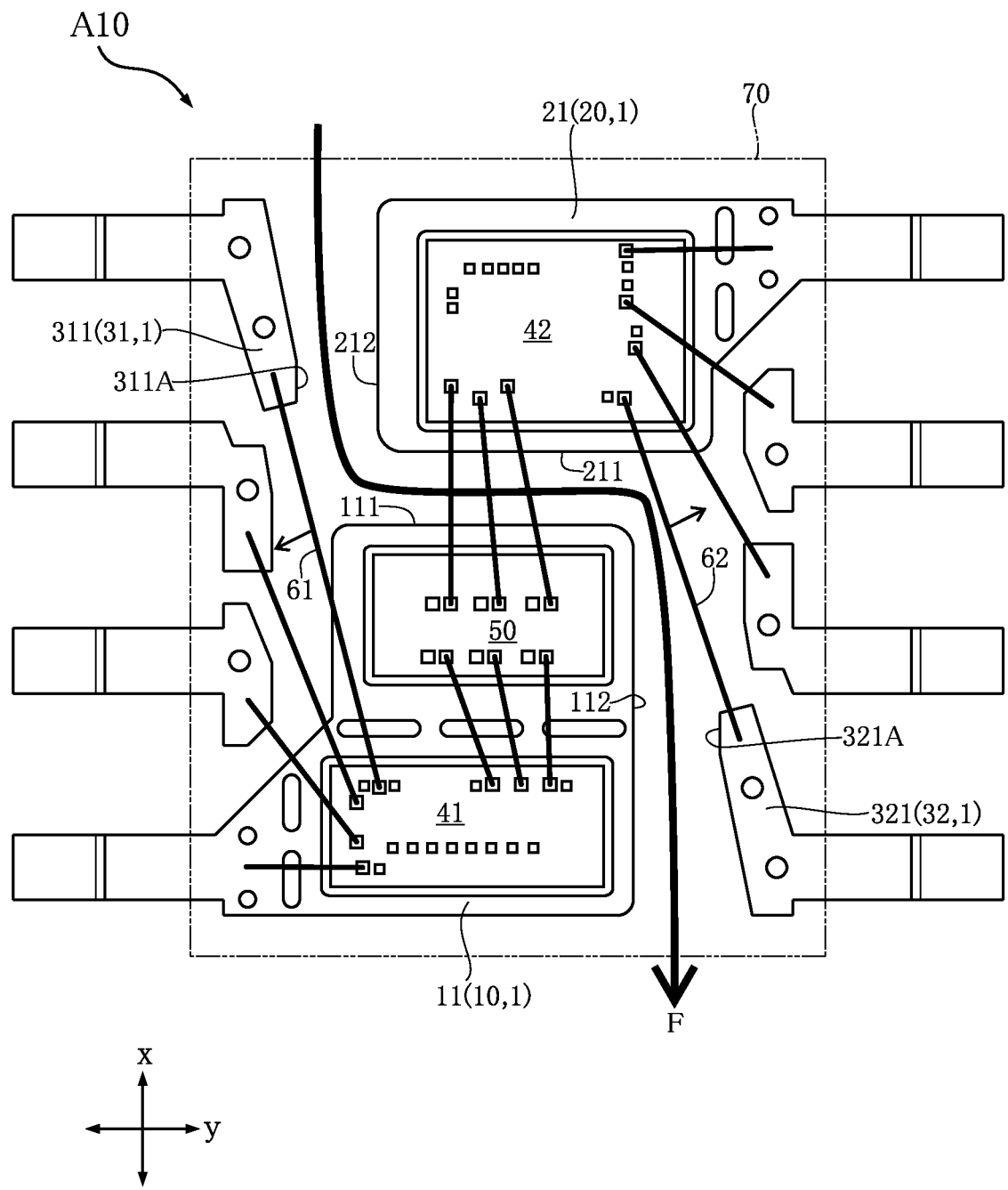
FIG. 21 is a plan view illustrating advantages of the semiconductor device of FIG. 1.

In the semiconductor device A10, the second pad portion 21 of the second lead 20 is adjacent to the first pad portion 11 of the first lead 10 in the first direction x. The second lead 20 belongs to the higher voltage section compared to the first lead 10. As viewed in the thickness direction z, the first pad portion 11 has the first edge 111 that is adjacent to the second pad portion 21 in the first direction x and extends in the second direction y. As viewed in the thickness direction z, the second pad portion 21 has the second edge 211 that is adjacent to the first edge 111 in the first direction x and extends in the second direction y. In the second direction y, either of the third end 211A and the fourth end 211B of the second edge 211 is located between the first end 111A and the second end 111B of the first edge 111. With this configuration, when the sealing resin 70 is formed in the manufacture of the semiconductor device A10, synthetic resin flows through the flow channel F having a crank-like shape as shown in FIG. 21. Advantageously, the portion of the flow channel F between the first edge 111 and the second edge 211 is parallel to the second direction y. This ensures that the resulting sealing resin 70 closely fills the space between the first pad portion 11 in the low voltage section and the first terminal portion 12 in the high voltage section without leaving voids. Consequently, the semiconductor device A10 can be configured compact without lowering the dielectric strength of the semiconductor device A10.

As shown in FIG. 21, when the sealing resin 70 is formed in the manufacture of the semiconductor device A10, synthetic resin flows through the flow channel F as viewed in the thickness direction z. By the flow of synthetic resin, the first wire 61 that connects the control element 41 mounted on the first pad portion 11 to the third pad portion 311 of the third lead 31 pushed in the direction of allow shown in FIG. 21, which is viewed in the thickness direction z. In view of this, the first wire 61 is offset outward from the insulating element 50 mounted on the first pad portion 11 as viewed in the thickness direction z. Similarly, the second wire 62 that connects the driver element 42 mounted on the second pad portion 21 to the fourth pad portion 321 of the fourth lead 32 is pushed in the direction of allow shown in FIG. 21, which is viewed in the thickness direction z. In view of this, the second wire 62 is placed to extend across the region between the third edge 112 of the first pad portion 11 and a line extended from the sixth edge 213 of the second pad portion 21 in the second direction y as shown in FIG. 2 viewed in the thickness direction z. These arrangements of the first wire 61 and the second wire 62 ensure that they are not pushed closer to the insulating element 50. Decrease of the dielectric strength of the semiconductor device A10 can therefore be avoided.

As viewed in the thickness direction z, the third edge 112 of the first pad portion 11 is connected to one of the first end 111A and the second end 111B of the first edge 111 that is located between the third end 211A and the fourth end 211B of the second edge 211 of the second pad portion 21 in the second direction y. The fourth edge 212 of the second pad portion 21 is connected to one of the third end 211A and the fourth end 211B of the second edge 211 that is located between the first end 111A and the second end 111B of the first edge 111 in the second direction y. The third edge 112 and the fourth edge 212 both include a segment extending in the first direction x. With this configuration, when the sealing resin 70 is formed in the manufacture of the semiconductor device A10, the flow of synthetic resin is caused to more closely follow the flow channel F as viewed in the thickness direction z. The above-described advantage is further increased, and the decrease of the dielectric strength of the semiconductor device A10 is more effectively prevented.

The first side surface 71 and the second side surface 72 of the sealing resin 70 are spaced apart from each other in the first direction x. The first side surface 71 has the first gate mark 75 formed thereon. The first gate mark 75 has a region lying between a line extended from the fourth edge 212 of the second pad portion 21 and a line extended from the fifth edge 113 of the first pad portion 11 in the second direction y. The second side surface 72 has the second gate mark 76 formed thereon. The second gate mark 76 has a region lying between a line extended from the third edge 112 of the first pad portion 11 and a line extended from the sixth edge 213 of the second pad portion 21. The gate marks appear as a result that the gates through which synthetic resin flows in and out are formed at positions corresponding to the ends of the flow channel F shown in FIG. 21, when the sealing resin 70 is formed in the manufacture of the semiconductor device A10.

The semiconductor device A10 is configured such that the conductive support member 1 is not exposed on the first side surface 71 and the second side surface 72 of the sealing resin 70. The semiconductor device A10 is therefore provided with a longer insulation distance in the second direction y. This is effective to prevent the decrease of the dielectric strength of the semiconductor device A10.

The third edge 112 of the first pad portion 11 has the third-edge connecting portion 112A connected to one of the first end 111A and the second end 111B of the first edge 111. The third-edge connecting portion 112A is convex toward the outside of the first pad portion 11. The fourth edge 212 of the second pad portion 21 has the fourth-edge connecting portion 212A connected to one of the third end 211A and the fourth end 211B of the second edge 211. This configuration is more effective to prevent the decrease of the dielectric strength between the first pad portion 11 in the low voltage section and the second pad portion 21 in the high voltage section.

As viewed in the thickness direction z, the third pad portion 311 has the third-pad proximate edge 311A, which is a nearest edge to the fourth edge 212 of the second pad portion 21. The third-pad proximate edge 311A extends in the first direction x. As a result, the portion of the flow channel F shown in FIG. 21 is more parallel to the first direction x between the fourth edge 212 and the third-pad proximate edge 311A. Consequently, the space between the third pad portion 311 in the low voltage section and the second pad portion 21 in the high voltage section is closely filled with the sealing resin 70 without leaving voids. This is effective to prevent the decrease of the dielectric strength between them.

The third pad portion 311 extends from the third terminal portion 312 of the third lead 31 toward the first pad portion 11. Thus, the length of the first wire 61 connecting the third pad portion 311 to the control element 41 can be shorter. The shorter first wire 61 is less likely to be pushed toward to the insulating element 50.

As viewed in the thickness direction z, the fourth pad portion 321 has the fourth-pad proximate edge 321A, which is a nearest edge to the third edge 112. The fourth-pad proximate edge 321A extends in the first direction x. As a result, the portion of the flow channel F shown in FIG. 21 is more parallel to the first direction x between the third edge 112 and the fourth-pad proximate edge 321A. Consequently, the space between the fourth pad portion 321 in the high voltage section and the first pad portion 11 in the low voltage section is closely filled with the sealing resin 70 without leaving voids. This is effective to prevent the decrease of the dielectric strength between them.

The fourth pad portion 321 extends from the fourth terminal portion 322 of the fourth lead 32 toward the second pad portion 21. Thus, the length of the second wire 62 connecting the driver element 42 to the fourth pad portion 321 can be shorter. The shorter second wire 62 is less likely to be pushed toward to the insulating element 50.

As shown in FIGS. 10 and 11, the first upper portion 711 of the first side surface 71 and the second upper portion 721 of the second side surface 72 have a height h1, whereas the first lower portion 712 of the first side surface 71 and the second lower portion 722 of the second side surface 72 have a height h2. The height h1 is greater than the Neigh h2. This means that the larger minimum thickness of the sealing resin 70 is increased to be sufficient for covering the first wires 61, the second wires 62, the third wire 63 and the fourth wires 64. This is effective to prevent the decrease of the dielectric strength of the semiconductor device A10.

Second Embodiment

Figure 22:
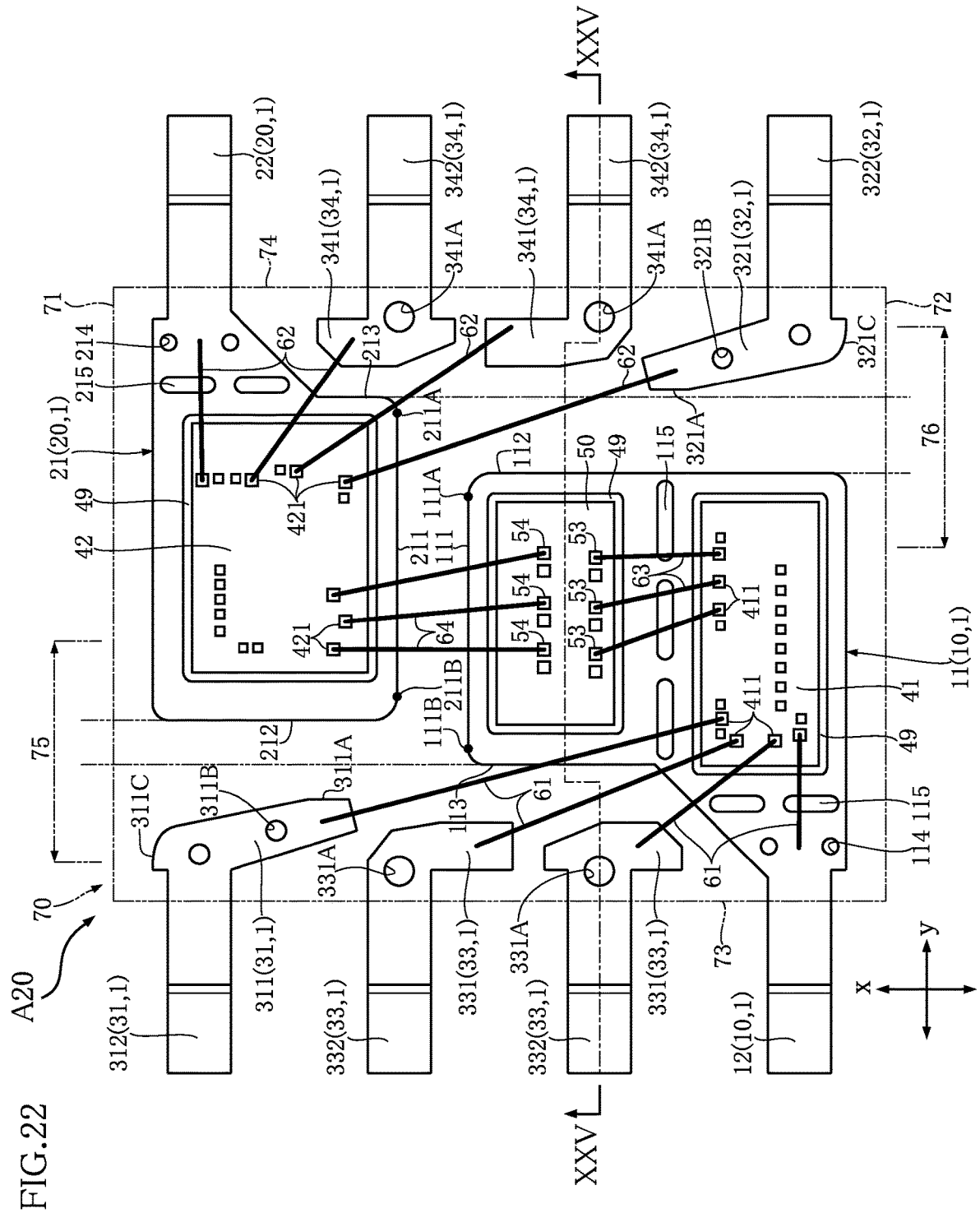
FIG. 22 is a plan view of a semiconductor device according to a second embodiment of the present disclosure, as seen through a sealing resin.

With reference to FIGS. 22 to 25, a semiconductor device A20 according to a second embodiment of the present disclosure will be described. In these figures, elements similar to those of the semiconductor device A10 are denoted by the same reference signs and a description thereof is omitted. For convenience, FIG. 22 shows the sealing resin 70 in phantom by imaginary lines (two-dot chain lines).

The semiconductor device A20 differs from the semiconductor device A10 in the configurations of the third lead 31, the fourth lead 32, the fifth leads 33 and the sixth leads 34.

Figure 23:
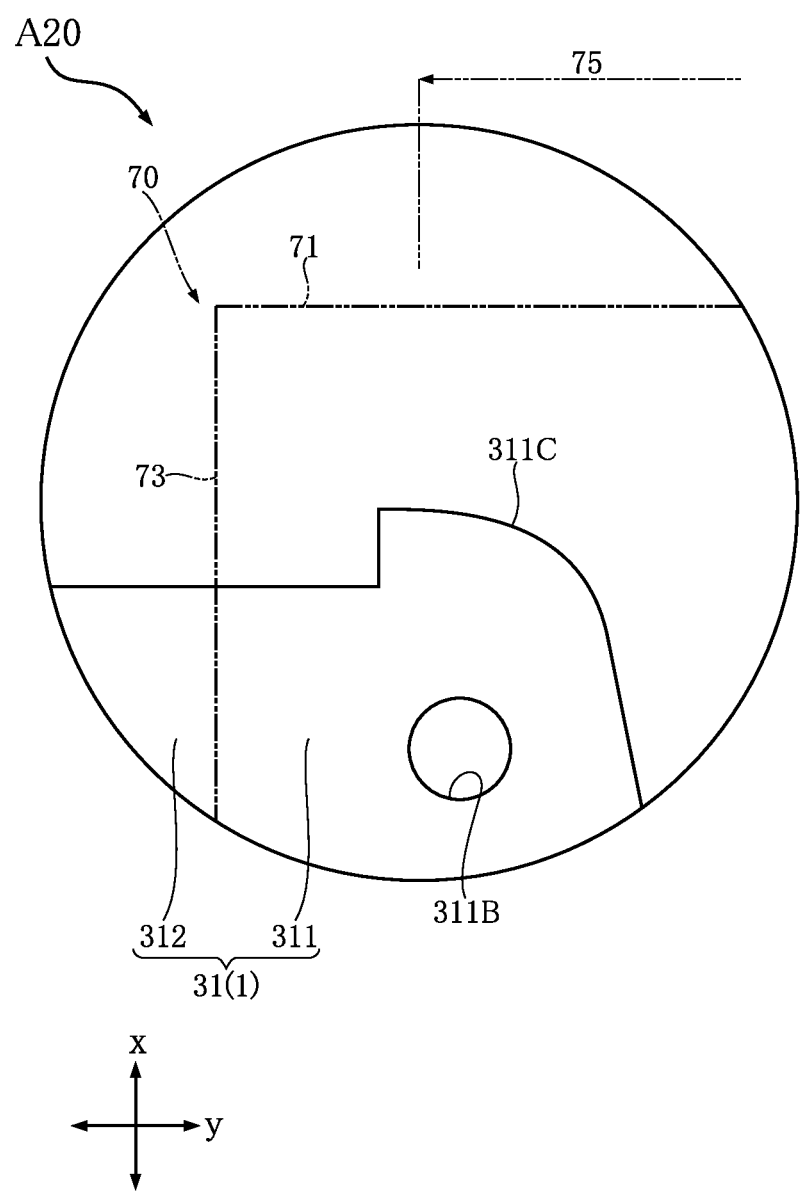
FIG. 23 is an enlarged view showing a part of FIG. 22.

As shown in FIGS. 22 and 23, the third pad portion 311 of the third lead 31 has a third-pad curved edge 311C. As viewed in the thickness direction z, third-pad curved edge 311C is adjacent to the first gate mark 75 of the sealing resin 70 in the first direction x. The third-pad curved edge 311C is convex toward the first gate mark 75.

Figure 24:
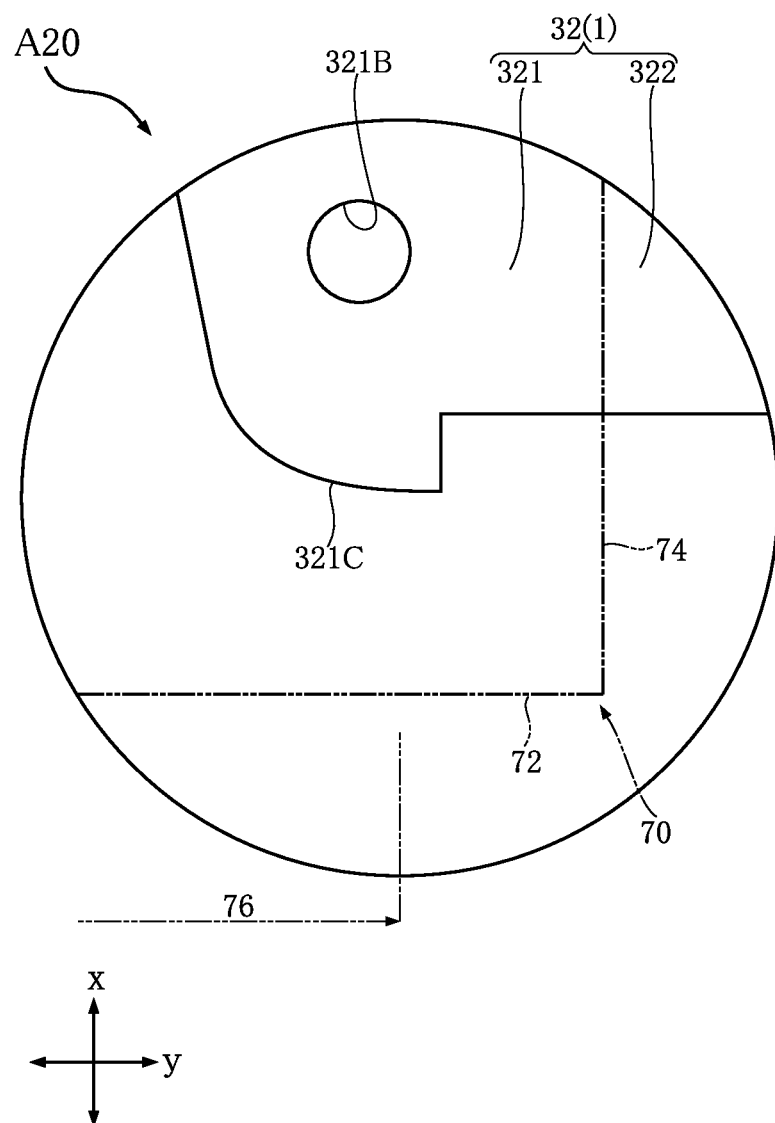
FIG. 24 is an enlarged view showing a part of FIG. 22.

As shown in FIGS. 23 and 24, the fourth pad portion 321 of the fourth lead 32 has a fourth-pad curved edge 321C. As viewed in the thickness direction z, the fourth-pad curved edge 321C is adjacent to the second gate mark 76 of the sealing resin 70 in the first direction x. The fourth-pad curved edge 321C is convex toward the second gate mark 76.

Figure 25:
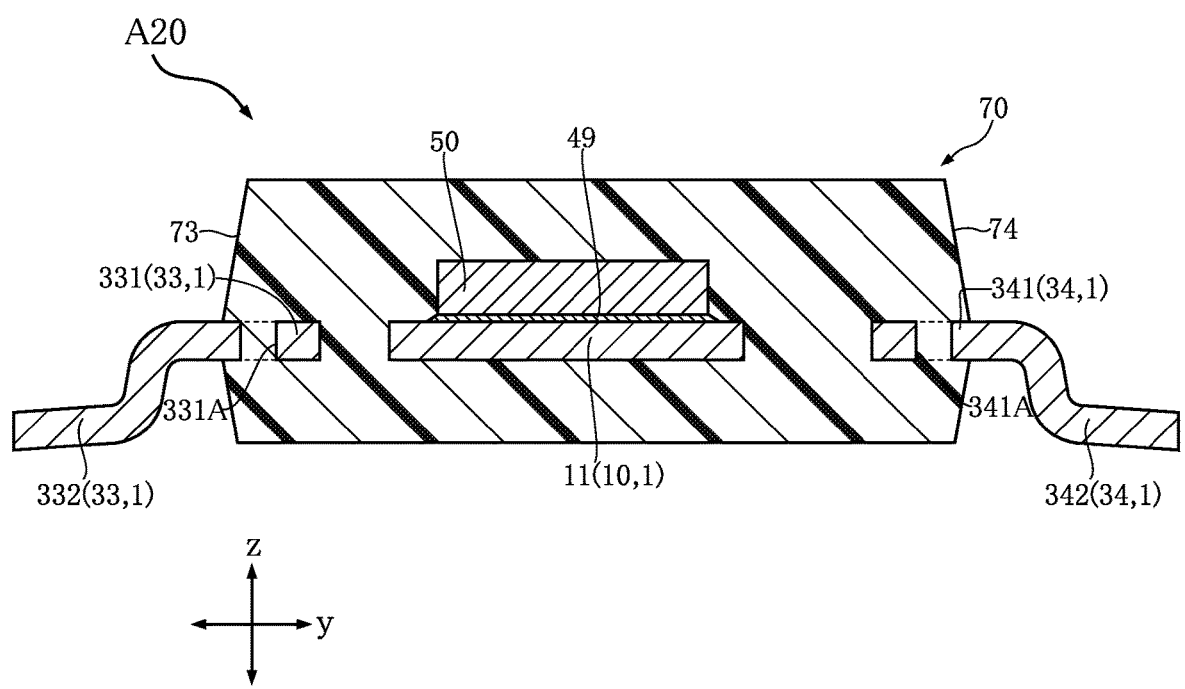
FIG. 25 is a sectional view taken along line XXV-XXV of FIG. 22.

As shown in FIG. 22, the fifth pad portion 331 of each fifth lead 33 has a fifth through hole 331A that is larger in diameter than the fifth through hole 331A of the semiconductor device A10. As shown in FIG. 25, the fifth through hole 331A is filled with the sealing resin 70.

As shown in FIG. 22, the sixth pad portion 341 of each sixth lead 34 has a sixth through hole 341A that is larger in diameter than the sixth through hole 341A of the semiconductor device A10. As shown in FIG. 25, the sixth through hole 341A is filled with the sealing resin 70.

Next, advantages of the semiconductor device A20 will be described.

In the semiconductor device A20, the second pad portion 21 of the second lead 20 is adjacent to the first pad portion 11 of the first lead 10 in the first direction x. The second lead 20 belongs to a higher voltage section compared to the first lead 10. As viewed in the thickness direction z, the first pad portion 11 has the first edge 111 that is adjacent to the second pad portion 21 in the first direction x and extends in the second direction y. As viewed in the thickness direction z, the second pad portion 21 has the second edge 211 that is adjacent to the first edge 111 in the first direction x and extends in the second direction y. In the second direction y, either of the first end 111A and the second end 111B of the first edge 111 is located between the third end 211A and the fourth end 211B of the second edge 211. Consequently, the semiconductor device A20 can be configured compact without decrease of the dielectric strength of the semiconductor device A20.

In the semiconductor device A20, the third pad portion 311 of the third lead 31 has the third-pad curved edge 311C. As viewed in the thickness direction z, the third-pad curved edge 311C is adjacent to the first gate mark 75 of the sealing resin 70 in the first direction x and convex toward first gate mark 75. This helps to form the sealing resin 70 without a crack near the first gate mark 75.

In the semiconductor device A20, the fourth pad portion 321 of the fourth lead 32 has the fourth-pad curved edge 321C. As viewed in the thickness direction z, the fourth-pad curved edge 321C is adjacent to the second gate mark 76 of the sealing resin 70 in the first direction x and convex toward second gate mark 76. This helps to form the sealing resin 70 without a crack near the second gate mark 76.

Each fifth lead 33 has the fifth through hole 331A that extends through the fifth pad portion 331 in the thickness direction z. The fifth pad portions 331 are covered by the sealing resin 70. In the semiconductor device A20, the sealing resin 70 fills the fifth through holes 331A. If a force is applied to pull out a fifth lead 33 from the sealing resin 70, the portion of the sealing resin 70 present in the fifth through hole 331A resists the force. This prevents detachment of the fifth lead 33 from the sealing resin 70.

The sixth lead 34 has the sixth through hole 341A that extends through the sixth pad portion 341 in the thickness direction z. The sixth pad portions 341 are covered by the sealing resin 70. In the semiconductor device A20, the sealing resin 70 fills the sixth through holes 341A. If a force is applied to pull out a sixth lead 34 from the sealing resin 70, the portion of the sealing resin 70 present in the sixth through hole 341A resists the force. This prevents detachment of the sixth lead 34 from the sealing resin 70.

The present disclosure is not limited to the specific embodiments described above. The specific configuration of each part of the semiconductor device according to the present disclosure may be varied in design in many ways.

Embodiments of the present disclosure may be defined according to the following clauses.

Clause 1. A semiconductor device comprising:
  a conductive support member including a first lead having a first pad portion and a second lead having a second pad portion adjacent to the first pad portion in a first direction perpendicular to a thickness direction of the first lead;
  a control element mounted on the first pad portion;
  an insulating element mounted on the first pad portion and electrically connected to the control element;
  a driver element mounted on the second pad portion and electrically connected to the insulating element; and
  a sealing resin covering the first pad portion, the second pad portion, the control element, the insulating element and the driver element,
  wherein as viewed in the thickness direction, the first pad portion has a first edge adjacent to the second pad portion in the first direction and extending in a second direction perpendicular to the thickness direction and the first direction,
  as viewed in the thickness direction, the second pad portion has a second edge adjacent to the first edge in the first direction and extending in the second direction,
  the first edge has a first end and a second end that are opposite in the second direction, the second edge has a third end and a fourth end that are opposite in the second direction, and one of the third end and the fourth end is located between the first end and the second end in the second direction.

C

Clause 2. The semiconductor device according to Clause 1, wherein as viewed in the thickness direction, the first pad portion has a third edge including a segment extending in the first direction, the third edge is connected to one of the first end and the second end that is located between the third end and the fourth end in the second direction, as viewed in the thickness direction, the second pad portion has a fourth edge including a segment extending in the first direction, and the fourth edge is connected to the one of the third end and the fourth end that is located between the first end and the second end in the second direction.

Clause 3. The semiconductor device according to Clause 2, wherein the conductive support member further includes a third lead and a fourth lead, the third lead has a third pad portion adjacent to the fourth edge in the second direction and covered by the sealing resin, the fourth lead has a fourth pad portion adjacent to the third edge in the second direction and covered by the sealing resin, and the semiconductor device further comprises:

a first wire connecting the control element and the third pad portion, and a second wire connecting the driver element and the fourth pad portion.

Clause 4. The semiconductor device according to Clause 3, wherein the sealing resin has a first side surface and a second side surface spaced apart from each other in the first direction, the first side surface is adjacent to the second pad portion and the third pad portion, the second side surface is adjacent to the first pad portion and the fourth pad portion, the first side surface has a first gate mark having a higher surface roughness than another region of the first side surface, and the second side surface has a second gate mark having a higher surface roughness than another region of the second side surface.

Clause 5. The semiconductor device according to Clause 4, wherein the conductive support member is not exposed from the first side surface and the second side surface.

Clause 6. The semiconductor device according to Clause 5, wherein the first gate mark and the second gate mark are spaced apart from each other in the second direction.

Clause 7. The semiconductor device according to Clause 5 or 6, wherein as viewed in the thickness direction, the first pad portion has a fifth edge including a segment extending in the first direction, the fifth edge being spaced apart from the third edge in the second direction and connected to the first edge, and as viewed in the thickness direction, the second pad portion has a sixth edge including a segment extending in the first direction, the sixth edge being spaced apart from the fourth edge in the second direction and connected to the second edge.

Clause 8. The semiconductor device according to Clause 7, wherein as viewed in the thickness direction, the first gate mark includes a region lying between an extended line of the fourth edge and an extended line of the fifth edge in the second direction, and as viewed in the thickness direction, the second gate mark includes a region lying between an extended line of the third edge and an extended line of the sixth edge in the second direction.

Clause 9. The semiconductor device according to Clause 8, the third edge includes a third-edge connecting portion connected to one of the first end and the second end, the third-edge connecting portion is convex toward outside of the first pad portion, the fourth edge includes a fourth-edge connecting portion connected to one of the third end and the fourth end, and the fourth-edge connecting portion is convex toward outside of the second pad portion.

Clause 10. The semiconductor device according to Clause 9, as viewed in the thickness direction, the third pad portion has a third-pad proximate edge extending in the first direction, the third-pad proximate edge being a nearest edge of the third pad portion to the fourth edge, and as viewed in the thickness direction, the fourth pad portion has a fourth-pad proximate edge extending in the first direction, the fourth-pad proximate edge being a nearest edge of the fourth pad portion to the third edge.

Clause 11. The semiconductor device according to Clause 10, wherein as viewed in the thickness direction, the third pad portion has a third-pad curved edge adjacent to the first gate mark in the first direction, the third-pad curved edge is convex toward the first gate mark, as viewed in the thickness direction, the fourth pad portion has a fourth-pad curved edge adjacent to the second gate mark in the first direction, and the fourth-pad curved edge is convex toward the second gate mark.

Clause 12. The semiconductor device according to Clause 11, wherein the insulating element is located between the control element and the driver element in the first direction.

Clause 13. The semiconductor device according to Clause 12, wherein as viewed in the thickness direction, the first wire is offset outward from the insulating element, and as viewed in the thickness direction, the second wire extends across a region between the third edge and an extended line of the sixth edge in the second direction.

Clause 14. The semiconductor device according to Clause 12 or 13, wherein the sealing resin has a third side surface and a fourth side surface spaced apart from each other in the second direction, the first lead has a first terminal portion connected to the first pad portion and exposed from the third side surface, the second lead has a second terminal portion connected to the second pad portion and exposed from the fourth side surface, the third lead has a third terminal portion connected to the third pad portion and exposed from the third side surface, and the fourth lead has a fourth terminal portion connected to the fourth pad portion and exposed from the fourth side surface.

Clause 15. The semiconductor device according to Clause 14, wherein the conductive support member further includes a fifth lead and a sixth lead, the fifth lead has a fifth pad portion covered by the sealing resin and a fifth terminal portion connected to the fifth pad portion and exposed from the third side surface, the fifth terminal portion being located between the first terminal portion and the third terminal portion, the sixth lead has a sixth pad portion covered by the sealing resin and a sixth terminal portion connected to the sixth pad portion an exposed from the fourth side surface, the sixth terminal portion being located between the second terminal portion and the fourth terminal portion, each of the fifth pad portion and the sixth pad portion has a through hole extending in the thickness direction, and a portion of the sealing resin is present in each of the through holes.

The invention claimed is:

1. A semiconductor device comprising:
a conductive support member including:
  a first lead having a first pad portion;
  a second lead having a second pad portion adjacent to the first pad portion in a first direction perpendicular to a thickness direction of the first lead;
  a third lead facing the second pad portion in a second direction perpendicular to the thickness direction and the first direction;
  a fourth lead facing the first pad portion in the second direction);
  a fifth lead adjacent to the first lead in the first direction;
  a sixth lead adjacent to the second lead in the first direction;
  a seventh lead disposed between the third lead and the fifth lead in the first direction; and
  an eighth lead disposed between the fourth lead and the sixth lead in the first direction;
a first electronic functional chip mounted on the first pad portion;
a second electronic functional chip mounted on the second pad portion; and
a sealing resin covering at least the first pad portion, the second pad portion, the first electronic functional chip, and the second electronic functional chip, the sealing resin having a first side surface and a second side surface spaced apart from each other in the first direction, and also having a third side surface and a fourth side surface spaced apart from each other in the second direction, wherein, as viewed in the thickness direction, the first pad portion has a first edge adjacent to the second pad portion in the first direction and extending in the second direction, the first edge has a first end and a second end that are opposite in the second direction, as viewed in the thickness direction, the second pad portion has a second edge adjacent to the first edge in the first direction and extending in the second direction, the second edge has a third end and a fourth end that are opposite in the second direction, one of the third end and the fourth end is located between the first end and the second end in the second direction, the fifth lead and the seventh lead include a fifth inner portion and a seventh inner portion, respectively, that are covered by the sealing resin, each of the fifth and the seventh inner portions having a first edge inclined relative to the first direction and the second direction, the sixth lead and the eighth lead include a sixth inner portion and an eighth inner portion, respectively, that are covered by the sealing resin, each of the sixth and the eight inner portions having a first edge inclined relative to the first direction and the second direction, the fifth inner portion has a second edge and a third edge other than the first edge thereof, the second edge and the third edge of the fifth inner portion being connected to each other and disposed to face the first lead, and the sixth inner portion has a second edge and a third edge other than the first edge thereof, the second edge and the third edge of the sixth inner portion being connected to each other and disposed to face the second lead, as viewed in the thickness direction, the fifth lead and the eighth lead face each other in the second direction with an axis parallel to the first direction intervening between the fifth lead and the eighth lead, the axis passing through the first electronic functional chip and the second electronic functional chip, as viewed in the thickness direction, the sixth lead and the seventh lead face each other in the second direction with the axis intervening between the sixth lead and the seventh lead, and the fifth lead and the seventh lead protrude outwards from the third side surface, while the sixth lead and the eighth lead protrude outwards from the fourth side surface.

2. The semiconductor device according to claim 1,
wherein, as viewed in the thickness direction, the first pad portion has a third edge including a segment extending in the first direction, the third edge is connected to one of the first end and the second end that is located between the third end and the fourth end in the second direction, as viewed in the thickness direction, the second pad portion has a fourth edge including a segment extending in the first direction, and the fourth edge is connected to the one of the third end and the fourth end that is located between the first end and the second end in the second direction.

3. The semiconductor device according to claim 2,
wherein the third lead has a third pad portion adjacent to the fourth edge in the second direction and covered by the sealing resin, the fourth lead has a fourth pad portion adjacent to the third edge in the second direction and covered by the sealing resin, and the semiconductor device further comprises:

a first wire connecting the first electronic functional chip and the third pad portion, and a second wire connecting the second electronic functional chip and the fourth pad portion.

4. The semiconductor device according to claim 3, wherein the first side surface is adjacent to the second pad portion and the third pad portion, the second side surface is adjacent to the first pad portion and the fourth pad portion, the first side surface has a first gate mark having a higher surface roughness than another region of the first side surface, and the second side surface has a second gate mark having a higher surface roughness than another region of the second side surface.

5. The semiconductor device according to claim 4, wherein the conductive support member is not exposed from the first side surface and the second side surface.

6. The semiconductor device according to claim 5, wherein the first gate mark and the second gate mark are spaced apart from each other in the second direction.

7. The semiconductor device according to claim 5, wherein, as viewed in the thickness direction, the first pad portion has a fifth edge including a segment extending in the first direction, the fifth edge being spaced apart from the third edge in the second direction and connected to the first edge, and as viewed in the thickness direction, the second pad portion has a sixth edge including a segment extending in the first direction, the sixth edge being spaced apart from the fourth edge in the second direction and connected to the second edge.

8. The semiconductor device according to claim 7, wherein, as viewed in the thickness direction, the first gate mark includes a region lying between an extended line of the fourth edge and an extended line of the fifth edge in the second direction, and as viewed in the thickness direction, the second gate mark includes a region lying between an extended line of the third edge and an extended line of the sixth edge in the second direction.

9. The semiconductor device according to claim 8, the third edge includes a third-edge connecting portion connected to one of the first end and the second end, the third-edge connecting portion is convex toward outside of the first pad portion, the fourth edge includes a fourth-edge connecting portion connected to one of the third end and the fourth end, and the fourth-edge connecting portion is convex toward outside of the second pad portion.

10. The semiconductor device according to claim 9, wherein, as viewed in the thickness direction, the third pad portion has a third-pad proximate edge extending in the first direction, the third-pad proximate edge being a nearest edge of the third pad portion to the fourth edge, and as viewed in the thickness direction, the fourth pad portion has a fourth-pad proximate edge extending in the first direction, the fourth-pad proximate edge being a nearest edge of the fourth pad portion to the third edge.

11. The semiconductor device according to claim 10, wherein, as viewed in the thickness direction, the third pad portion has a third-pad curved edge adjacent to the first gate mark in the first direction, the third-pad curved edge is convex toward the first gate mark, as viewed in the thickness direction, the fourth pad portion has a fourth-pad curved edge adjacent to the second gate mark in the first direction, and the fourth-pad curved edge is convex toward the second gate mark.

12. The semiconductor device according to claim 11, further comprising an insulating element mounted on the first pad portion and electrically connected to the first electronic functional chip, wherein the insulating element is located between the first electronic functional chip and the second electronic functional chip in the first direction.

13. The semiconductor device according to claim 12, wherein, as viewed in the thickness direction, the first wire is offset outward from the insulating element, and as viewed in the thickness direction, the second wire extends across a region between the third edge and an extended line of the sixth edge in the second direction.

14. The semiconductor device according to claim 12, wherein the first lead has a first terminal portion connected to the first pad portion and exposed from the third side surface, the second lead has a second terminal portion connected to the second pad portion and exposed from the fourth side surface, the third lead has a third terminal portion connected to the third pad portion and exposed from the third side surface, and the fourth lead has a fourth terminal portion connected to the fourth pad portion and exposed from the fourth side surface.

15. The semiconductor device according to claim 14, wherein the fifth lead has a fifth pad portion covered by the sealing resin and a fifth terminal portion connected to the fifth pad portion and exposed from the third side surface, the fifth terminal portion being located between the first terminal portion and the third terminal portion, the sixth lead has a sixth pad portion covered by the sealing resin and a sixth terminal portion connected to the sixth pad portion and exposed from the fourth side surface, the sixth terminal portion being located between the second terminal portion and the fourth terminal portion, each of the fifth pad portion and the sixth pad portion has a through hole extending in the thickness direction, and a portion of the sealing resin is present in each of the through holes.

* * * * *